US009859983B2

(12) United States Patent
Orcutt

(10) Patent No.: US 9,859,983 B2
(45) Date of Patent: Jan. 2, 2018

(54) EXTERNAL CAVITY LASER BASED WAVELENGTH DIVISION MULTIPLEXING SUPERCHANNEL TRANSCEIVERS

(71) Applicant: INTERNATIONAL BUSINESS MACHINES CORPORATION, Armonk, NY (US)

(72) Inventor: Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/285,123

(22) Filed: Oct. 4, 2016

(65) Prior Publication Data

US 2017/0026131 A1    Jan. 26, 2017

Related U.S. Application Data

(62) Division of application No. 14/682,158, filed on Apr. 9, 2015, now Pat. No. 9,496,961.

(51) Int. Cl.
*H04B 10/50* (2013.01)
*G02B 6/293* (2006.01)
(Continued)

(52) U.S. Cl.
CPC ....... *H04B 10/503* (2013.01); *G02B 6/12004* (2013.01); *G02B 6/126* (2013.01); *G02B 6/2773* (2013.01); *G02B 6/29382* (2013.01); *H01S 3/2391* (2013.01); *H01S 5/0687* (2013.01); *H01S 5/06246* (2013.01); *H01S 5/06821* (2013.01); *H01S 5/1028* (2013.01); *H01S 5/14* (2013.01); *H01S 5/141* (2013.01); *H01S 5/146* (2013.01); *H01S 5/3013* (2013.01); *H01S 5/323* (2013.01); *H04B 10/506* (2013.01); *H04B 10/5053* (2013.01); *H04B 10/516* (2013.01);
(Continued)

(58) Field of Classification Search
CPC .. H04B 10/503; H04B 10/801; H04B 10/516; G02B 6/29382; G02B 6/2773; G02B 6/12004; G02B 6/126; H04J 14/06; H01S 5/323; H01S 5/06246; H01S 5/06821; H01S 5/0687; H01S 5/14; H01S 5/3013
See application file for complete search history.

(56) References Cited

U.S. PATENT DOCUMENTS

2003/0194166 A1* 10/2003 Madsen ................. G02B 6/278
                                                              385/11

* cited by examiner

*Primary Examiner* — Leslie Pascal
(74) *Attorney, Agent, or Firm* — Cantor Colburn LLP; Vazken Alexanian

(57) ABSTRACT

A technique relates to a superchannel. Laser cavities include a first laser cavity, a next laser cavity, through a last laser cavity. Modulators include a first modulator, a next modulator, through a last modulator, each having a direct input, an add port, and an output. A concatenated arrangement of the laser cavities is configured to form the superchannel, which includes the last laser cavity coupled to the direct input of the last modulator, and the output of the last modulator coupled to the add port of the next modulator. The arrangement includes the next laser cavity coupled to direct input of the next modulator, and the output of the next modulator coupled to add port of first modulator, along with the first laser cavity coupled to direct input of the first modulator, and the output of first modulator coupled to input of a multiplexer, thus forming the superchannel into multiplexer.

20 Claims, 24 Drawing Sheets

(51) Int. Cl.
*H04J 14/06* (2006.01)
*H01S 5/323* (2006.01)
*H04B 10/80* (2013.01)
*G02B 6/27* (2006.01)
*H01S 5/062* (2006.01)
*H01S 5/068* (2006.01)
*G02B 6/12* (2006.01)
*H01S 5/0687* (2006.01)
*H04B 10/516* (2013.01)
*H01S 5/30* (2006.01)
*H04J 14/02* (2006.01)
*H01S 5/14* (2006.01)
*H01S 5/10* (2006.01)
*H01S 3/23* (2006.01)
*G02B 6/126* (2006.01)
*H01S 5/02* (2006.01)
*H01S 5/028* (2006.01)
*H01S 5/04* (2006.01)
*H01S 5/40* (2006.01)

(52) U.S. Cl.
CPC ............ *H04B 10/801* (2013.01); *H04J 14/02* (2013.01); *H04J 14/06* (2013.01); *G02B 2006/12164* (2013.01); *H01S 5/021* (2013.01); *H01S 5/0287* (2013.01); *H01S 5/041* (2013.01); *H01S 5/142* (2013.01); *H01S 5/4031* (2013.01); *H01S 2301/163* (2013.01)

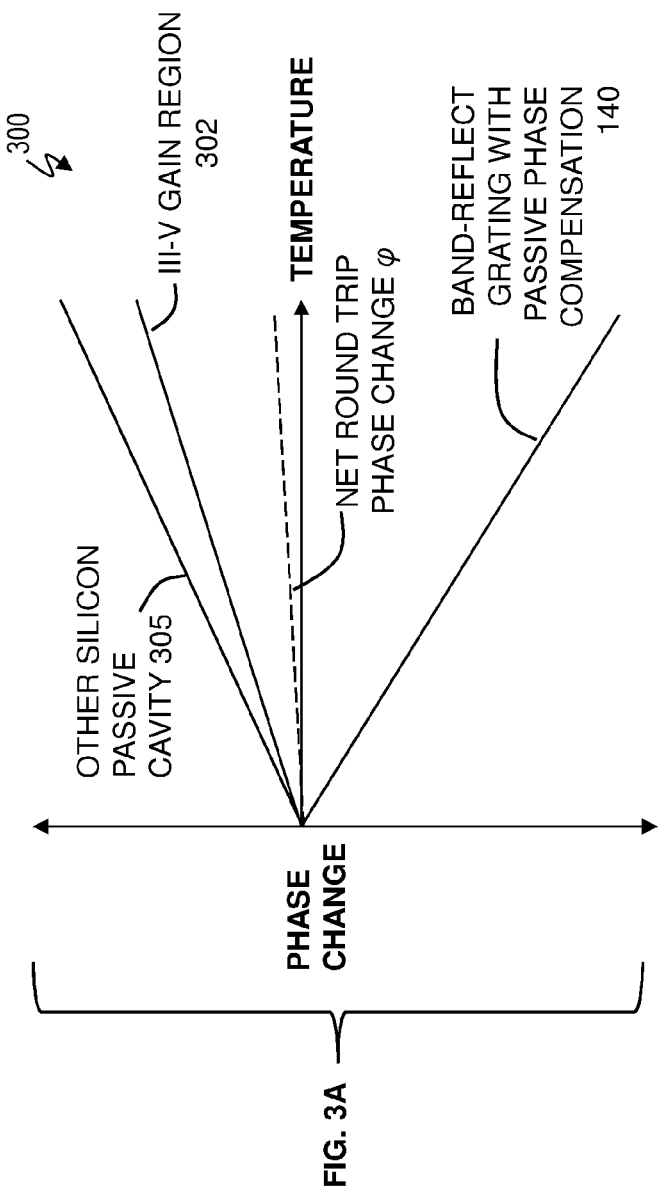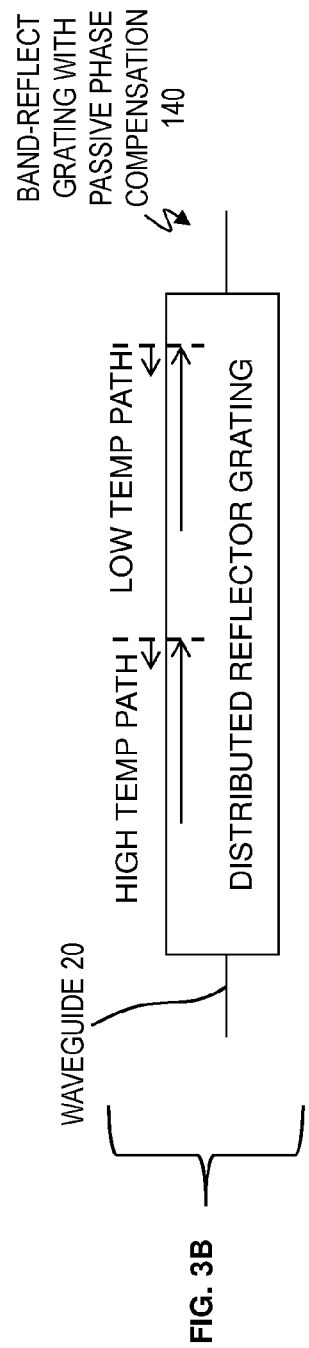
FIG. 3A
FIG. 3B

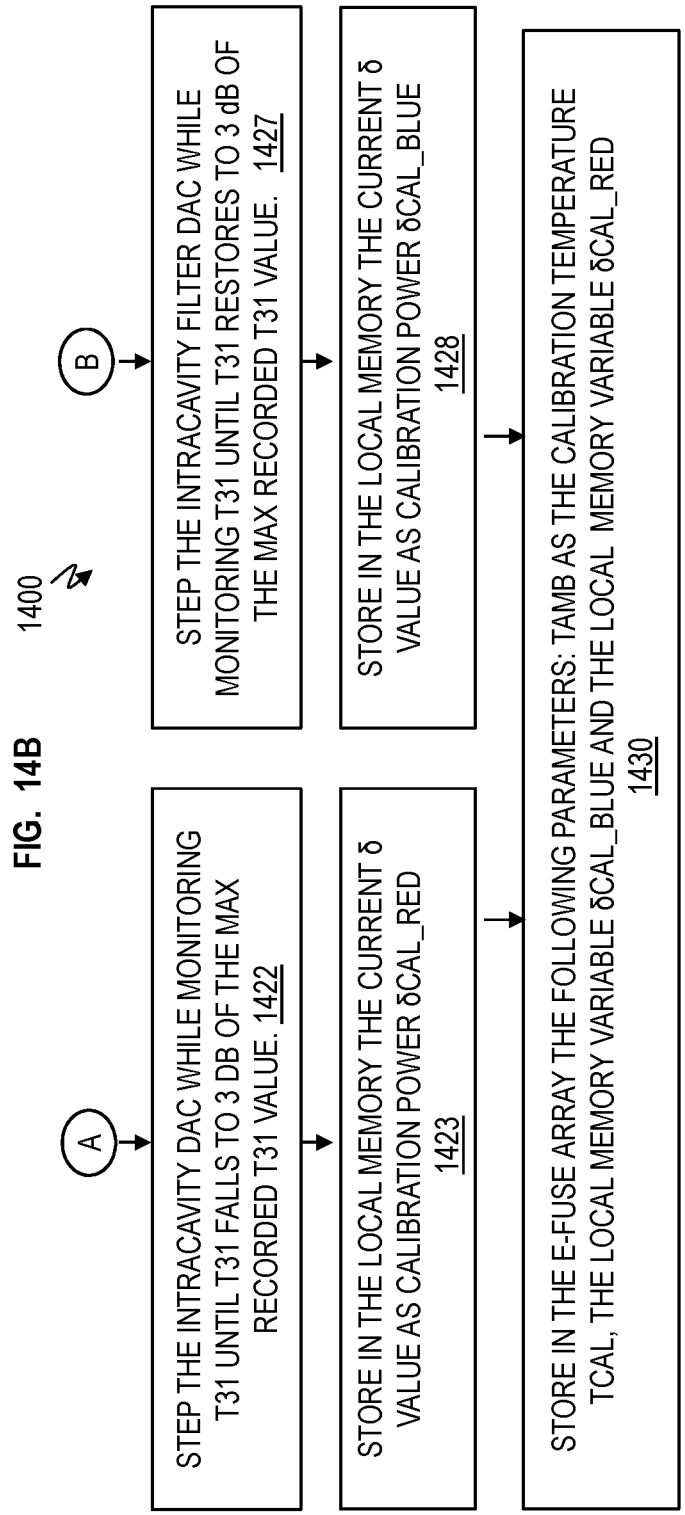

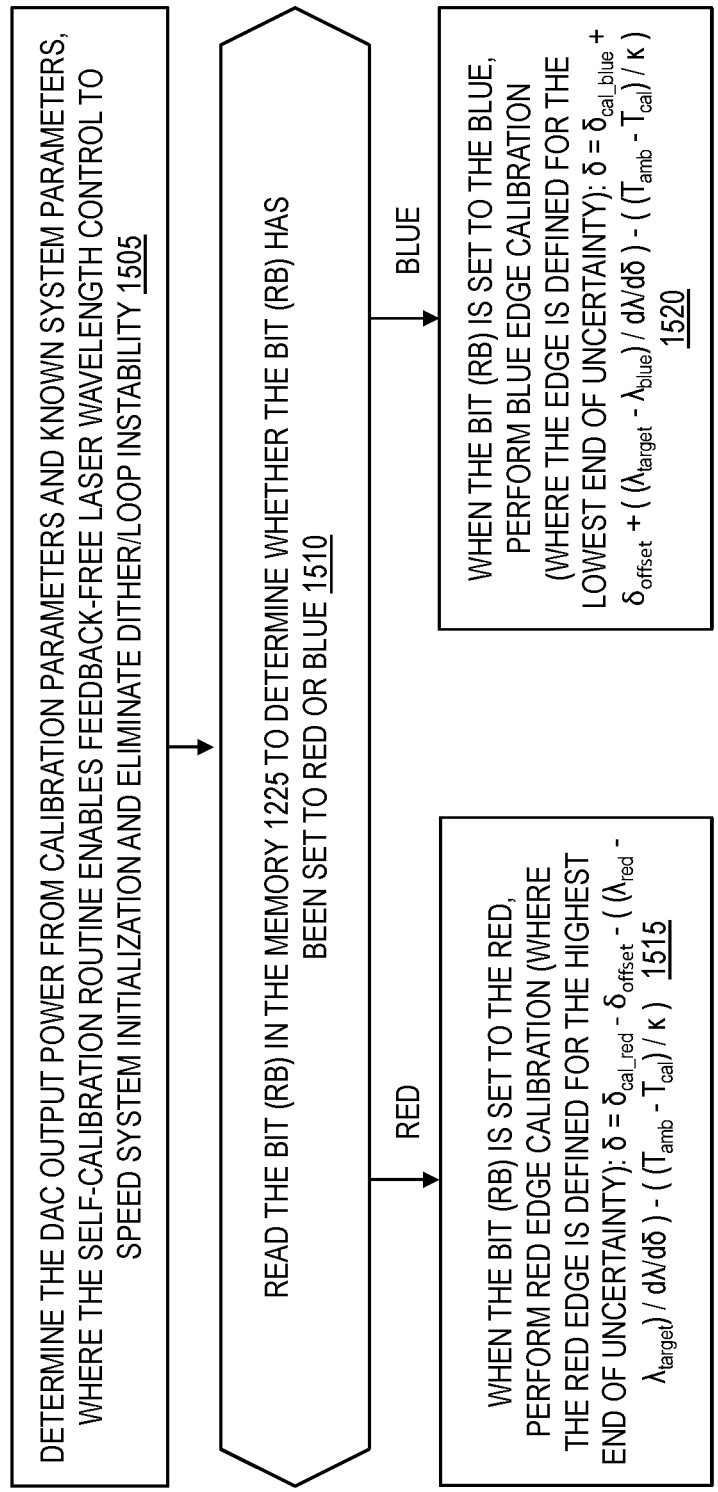

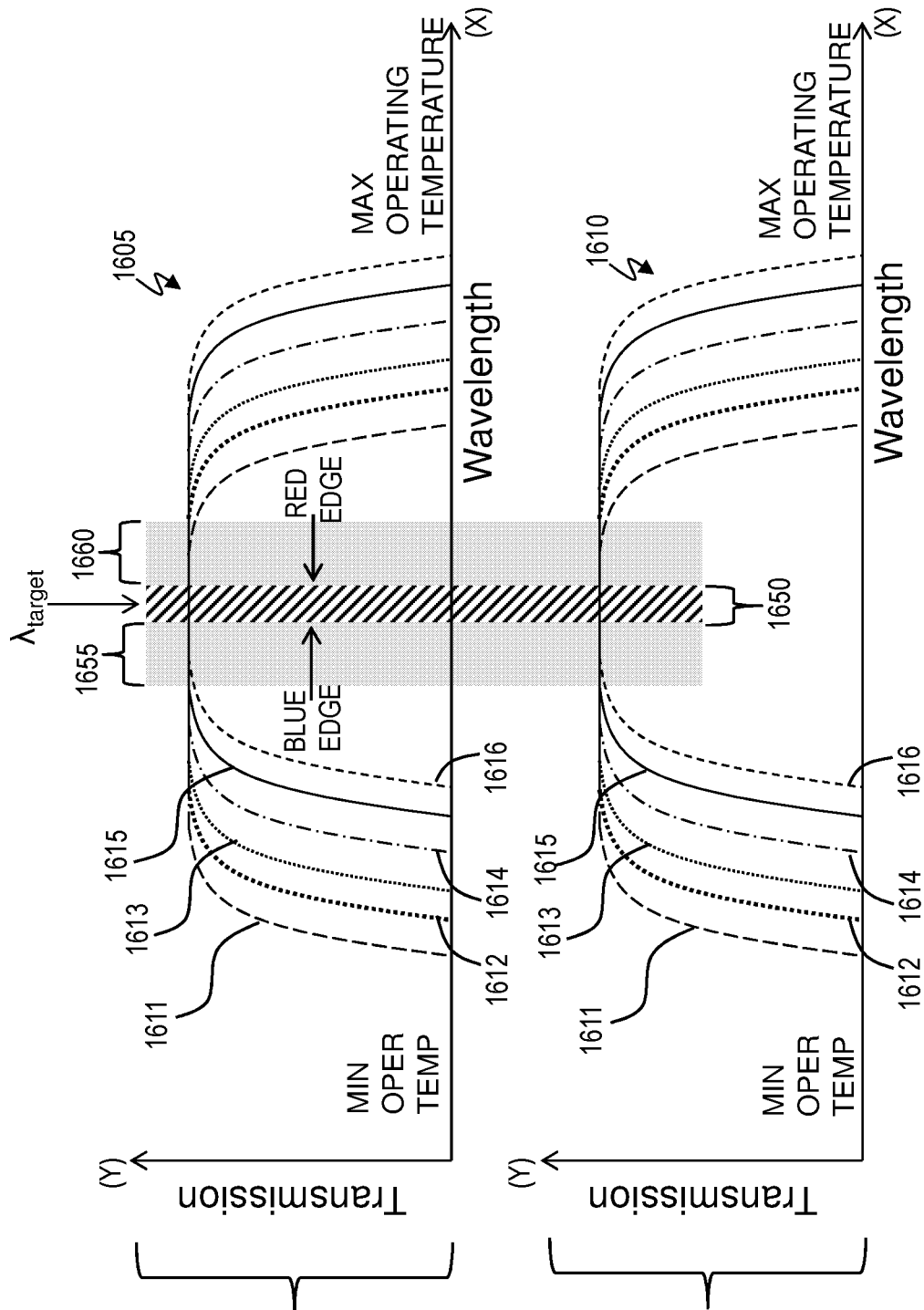

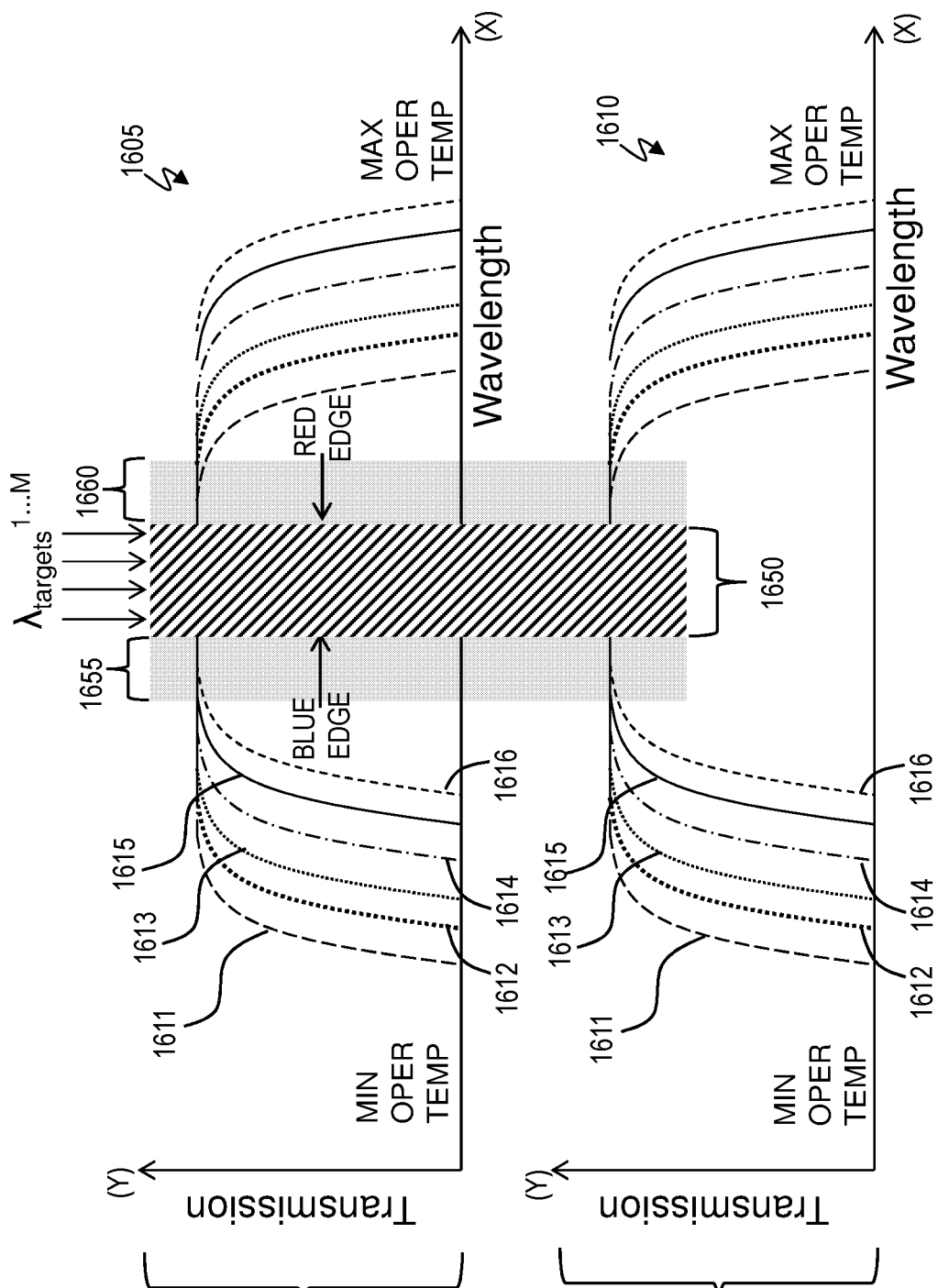

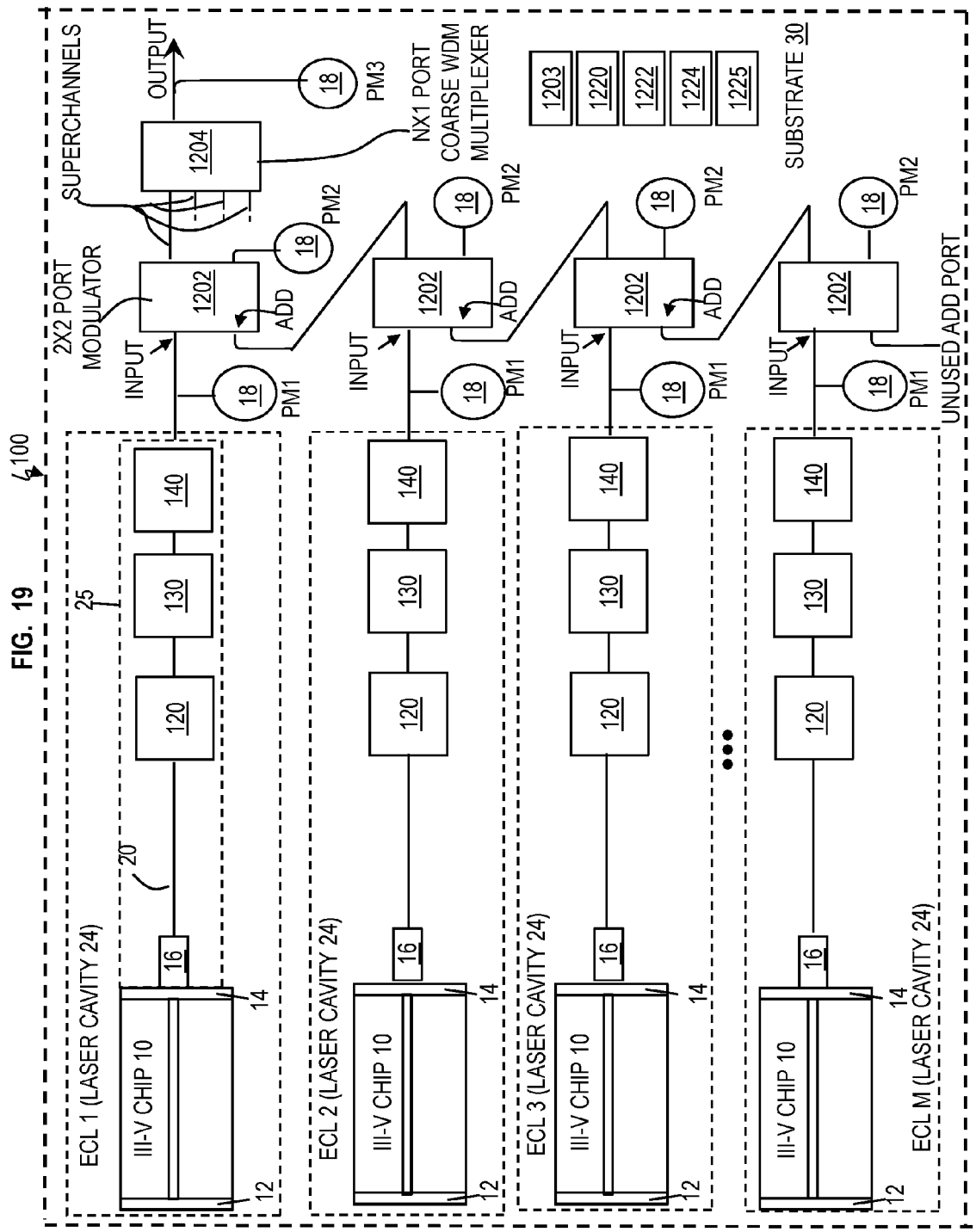

EXTERNAL CAVITY LASER BASED WAVELENGTH DIVISION MULTIPLEXING SUPERCHANNEL TRANSCEIVERS

This application is a divisional of U.S. patent application Ser. No. 14/682,158, filed Apr. 9, 2015, the disclosure of which is incorporated by reference herein in its entirety.

BACKGROUND

The present invention relates to an external cavity laser on silicon, and more specifically, to silicon external cavity laser based superchannel transceivers.

An optical cavity or optical resonator is an arrangement of mirrors that forms a standing wave cavity resonator for light waves. Optical cavities are a major component of lasers, surrounding the gain medium and providing feedback of the laser light. They are also used in optical parametric oscillators and some interferometers. Light confined in the cavity reflects multiple times, producing standing waves for certain resonance frequencies. The standing wave patterns produced are called modes. Longitudinal modes differ only in frequency while transverse modes differ for different frequencies and have different intensity patterns across the cross section of the beam.

Different resonator types are distinguished by the focal lengths of the two mirrors and the distance between them. Flat mirrors are not often used because of the difficulty of aligning them to the needed precision. The geometry (resonator type) must be chosen so that the beam remains stable, which means that the size of the beam does not continually grow with multiple reflections. Resonator types are also designed to meet other criteria such as minimum beam waist or having no focal point inside the cavity. Optical cavities are designed to have a large Q factor, which means that the light beam will reflect a very large number of times with little attenuation. Therefore, the frequency line width of the beam is very small compared to the frequency of the laser.

Light confined in a resonator will reflect multiple times from the mirrors, and due to the effects of interference, only certain patterns and frequencies of radiation will be sustained by the resonator, with the others being suppressed by destructive interference. In general, radiation patterns which are reproduced on every round-trip of the light through the resonator are the most stable, and these are the eigenmodes, known as the modes, of the resonator.

Resonator modes can be divided into two types: longitudinal modes, which differ in frequency from each other; and transverse modes, which may differ in both frequency and the intensity pattern of the light. The basic or fundamental transverse mode of a resonator is a Gaussian beam.

The most common types of optical cavities consist of two facing plane (flat) or spherical mirrors. The simplest of these is the plane-parallel or Fabry-Pérot cavity, consisting of two opposing flat mirrors. Plane-parallel resonators are therefore commonly used in microchip lasers, microcavity lasers, and semiconductor lasers. In these cases, rather than using separate mirrors, a reflective optical coating may be directly applied to the laser medium itself.

SUMMARY

According to one embodiment, a semiconductor chip configured to form a superchannel is provided. The semiconductor chip includes a plurality of laser cavities including a first laser cavity, a next laser cavity, through a last laser cavity, a wavelength division multiplexing (WDM) multiplexer, and a plurality of modulators including a first modulator, a next modulator, through a last modulator. Each of the plurality of modulators has a direct input, an add port, and an output. A concatenated arrangement of the plurality of laser cavities is configured to form the superchannel. The concatenated arrangement includes the last laser cavity coupled to the direct input of the last modulator, and the output of the last modulator coupled to the add port of the next modulator. Also, the concatenated arrangement includes the next laser cavity coupled to the direct input of the next modulator, and the output of the next modulator coupled to the add port of the first modulator. Further, the concatenated arrangement includes the first laser cavity coupled to the direct input of the first modulator, and the output of the first modulator coupled to one input of the WDM multiplexer, thus forming the superchannel being input into the one input of the WDM multiplexer.

According to one embodiment, a method of creating a superchannel on a semiconductor chip is provided. The method includes forming a plurality of laser cavities including a first laser cavity, a next laser cavity, through a last laser cavity and providing a plurality of modulators including a first modulator, a next modulator, through a last modulator. Each of the plurality of modulators has a direct input, an add port, and an output. Also, the method includes configuring a concatenated arrangement of the plurality of laser cavities to form a superchannel. The concatenated arrangement includes the last laser cavity coupled to the direct input of the last modulator, and the output of the last modulator coupled to the add port of the next modulator. Also, the concatenated arrangement includes the next laser cavity coupled to the direct input of the next modulator, and the output of the next modulator coupled to the add port of the first modulator. Further, the concatenated arrangement includes the first laser cavity coupled to the direct input of the first modulator, and the output of the first modulator coupled to one input of a wavelength division multiplexing (WDM) multiplexer, thus forming the superchannel being input into the one input of the WDM multiplexer.

According to one embodiment, a semiconductor chip configured as a receiver to receive a superchannel is provided. The semiconductor chip includes a polarization splitter rotator configured to receive and split received light of the superchannel, wavelength division multiplexing (WDM) demultiplexers configured to demultiplex the received light, and counter propagating drop filters configured to capture the received light at a particular target wavelength and generate an electrical signal. Each of the counter propagating drop filters is coupled to an electrical receiver, and the electrical receiver receives the electrical signal corresponding to the particular target wavelength.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3A illustrates a graph showing how the phase changes and passive phase compensation temperature changes correspondingly, according to an embodiment;

FIG. 3B illustrates a schematic of the passive intra-cavity transmission-mode optical phase compensation element with details according to and embodiment;

FIGS. 14A and 14B together illustrate a block diagram of a self-calibration routine according to an embodiment;

FIG. 15 illustrates a block diagram of normal operation control after the self-calibration routine according to an embodiment;

FIG. 16A is a graph illustrating an allowable target wavelength range at which to make/insert the target wavelength in order to pass through the pass band of the N×1 port CWDM multiplexer according to an embodiment;

FIG. 16B is a graph illustrating the allowable target wavelength range at which to make/insert the target wavelength according to an embodiment;

FIG. 17A is a graph illustrating an allowable target wavelength range at which to make/insert multiple target wavelengths (that form a superchannel) in order to pass through the pass band of the N×1 port CWDM multiplexer according to an embodiment;

FIG. 17B is a graph illustrating the allowable target wavelength range at which to make/insert the multiple target wavelengths according to an embodiment;

FIG. 19 illustrates a superchannel laser transmitter on a silicon chip according to an embodiment;

DETAILED DESCRIPTION

Figure 1:
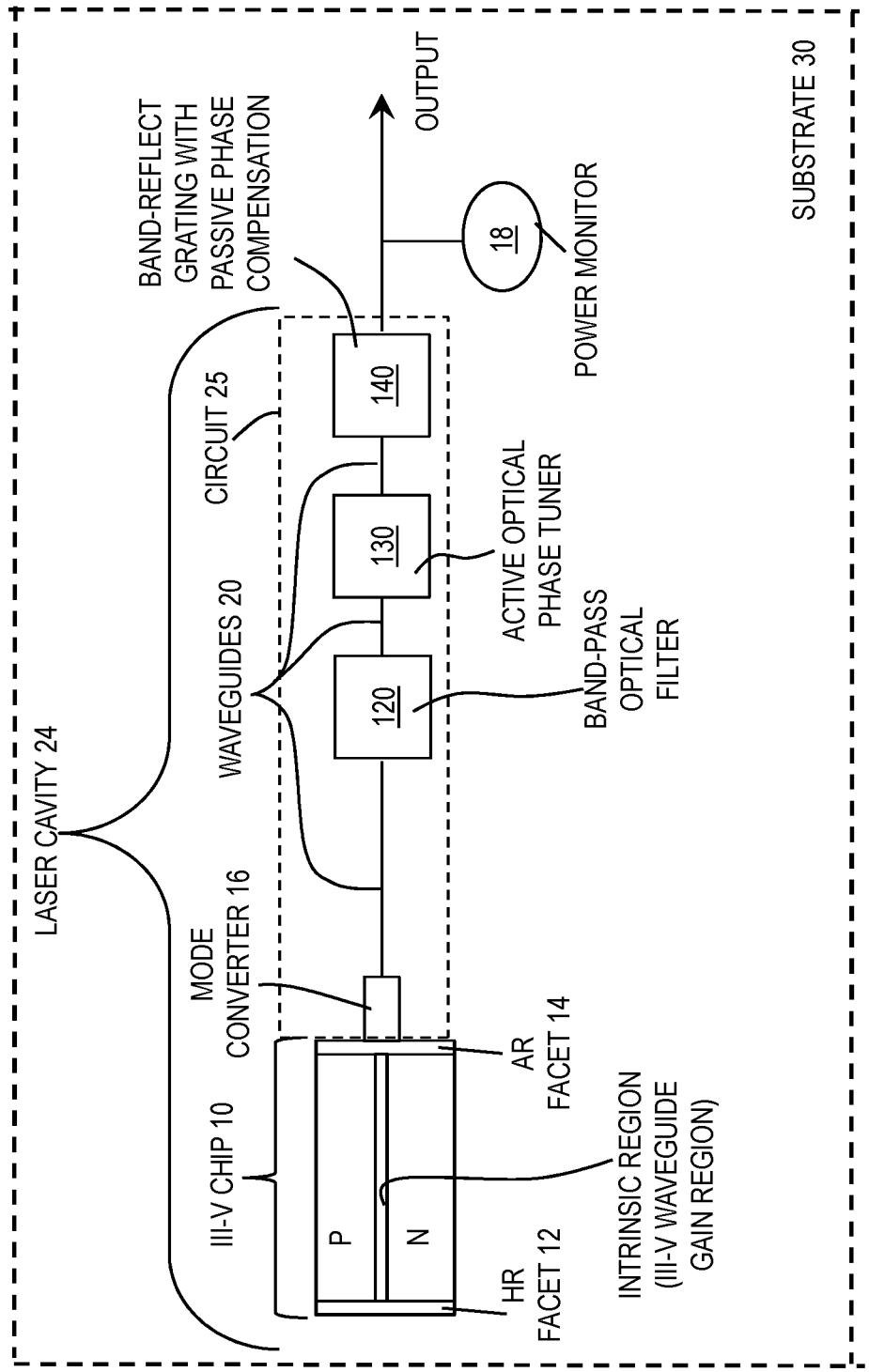
FIG. 1 illustrates a single frequency cavity diagram of a laser on a silicon chip according to an embodiment.

Although laser light is perhaps the purest form of light, it is not of a single, pure frequency or wavelength. All lasers produce light over some natural bandwidth or range of frequencies. A laser's bandwidth of operation is determined primarily by the gain medium from which the laser is constructed and by the range of frequencies over which a laser may operate (known as the gain bandwidth).

The second factor to determine a laser's emission frequencies is the optical cavity (or resonant cavity) of the laser. In the simplest case, this consists of two plane (flat) mirrors facing each other, surrounding the gain medium of the laser (again this arrangement is known as a Fabry-Pérot cavity). Since light is a wave, when bouncing between the mirrors of the cavity, the light will constructively and destructively interfere with itself, leading to the formation of standing waves or modes between the mirrors. These standing waves form a discrete set of frequencies, known as the longitudinal modes of the cavity. These modes are the only frequencies of light which are self-regenerating and allowed to oscillate by the resonant cavity, while all other frequencies of light are suppressed by destructive interference. For a simple plane-mirror cavity, the allowed modes are those for which the separation distance of the mirrors L is an exact multiple of half the wavelength of the light $\lambda$, such that $L=q\lambda/2$, where q is an integer known as the mode order.

In a simple laser, each of these modes oscillates independently, with no fixed relationship between each other, in essence like a set of independent lasers all emitting light at slightly different frequencies. The individual phase of the light waves in each mode is not fixed and may vary randomly due to such things as thermal changes (i.e., temperature) in materials of the laser. In lasers with only a few oscillating modes, interference between the modes can cause beating effects in the laser output, leading to fluctuations in intensity. In lasers with many thousands of modes, these interference effects tend to average to a near-constant output intensity.

Embodiments are configured to provide temperature insensitive (i.e., thermal insensitive) optical laser cavities. According to embodiments, the temperature insensitive external cavity lasers on silicon provide various benefits:

(1) Cost reduction is achievable by simplifying laser fabrication and eliminating operating wavelength tolerance as yield limitation. Lasing frequency is set by silicon fabricated components that have a high fabrication precision and inherent tunability with no extra cost.

(2) Stabilization of lasing frequency is achievable by active or passive means in the silicon fabricated section at any desired temperature throughout operation range.

(3) Relative intensity noise (RIN) may be reduced (performance improvement) by the cavity length increase and high-extinction intra-cavity optical filter.

(4) Narrowband filter used in the passive cavity may enable silicon on-chip isolator through time gating modulators at transceiver bitrate.

(5) The III-V chip is identical to plan-of-record distributed feedback (DFB) lasers except that the grating fabrication step is omitted by the laser vendor.

Now turning to the figures, FIG. 1 illustrates a single frequency cavity diagram of a laser on a silicon chip 100 according to an embodiment. The silicon chip 100 is a laser or laser system. Although silicon is discussed as an example chip and substrate material, it is understood that other semiconductor materials may be utilized including a germanium wafer.

The silicon chip 100 has a III-V chip 10 mounted on the substrate 30 (e.g., silicon wafer) of the silicon chip 100. The III-V chip 10 may also be referred to as a III-V die, a III-V semiconductor chip, and/an optical gain chip/medium as understood by one skilled in the art. The combination of the III-V chip 10 mounted on the silicon substrate 30 of the silicon chip 100 may be referred to as a hybrid silicon laser. The hybrid silicon laser is a semiconductor laser fabricated from both silicon and group III-V semiconductor materials. Group III and group V are designations on the periodic table. The hybrid approach takes advantage of the light-emitting properties of III-V semiconductor materials combined with the process maturity of silicon to fabricate electrically driven lasers on a silicon wafer that can be integrated with other silicon photonic devices.

The III-V chip 10 may be a laser diode that is an electrically pumped semiconductor laser in which the active (gain) medium is formed by a p-n junction (p-type doped region and n-type doped region) of a semiconductor diode similar to that found in a light-emitting diode. A laser diode is electrically a PIN diode (also referred to as a p-i-n diode), which is a diode with a wide, undoped intrinsic (I) semiconductor region between a p-type (P) semiconductor and an n-type (N) semiconductor region. The p-type and n-type regions are typically heavily doped because they are used for ohmic contacts. The active (gain) region of the laser diode is in the intrinsic (I) region, and the carriers (i.e., electrons and holes) are pumped into intrinsic (I) region from the N and P regions respectively. While initial diode laser research was conducted on simple P-N diodes, modern lasers use the double-heterostructure implementation, where the carriers and the photons are confined in order to maximize their chances for recombination and light generation. Unlike a regular diode used in electronics, the goal for a laser diode is that all carriers recombine in the I region and thus produce light. Accordingly, laser diodes are fabricated using direct bandgap semiconductors. The laser diode epitaxial structure is grown using one of the crystal growth techniques, usually starting from an N doped substrate, and growing the I doped active layer, followed by the P doped cladding, and a contact layer. The active layer most often consists of quantum wells, which provide lower threshold current and higher efficiency. A method of powering some laser diode is the use of optical pumping. Optically pumped semiconductor lasers (OPSL) use the III-V semiconductor chip 10 as the gain medium, and use another laser (often another diode laser) as the pump source. One skilled in the art understands the use and operation of a laser using a III-V semiconductor chip.

Referring back to FIG. 1, the III-V chip 10 has a high rear reflective (HR) coating facet 12 on one end and has antireflective (AR) coating facet 14 on the other end. The light increases in intensity in the gain region (intrinsic region (I)) of the III-V chip 10.

The III-V chip 10 is attached/mounted to silicon chip 100 and aligned for optical coupling by any flip-chip or wire-bond mounting option known to one skilled in the art. The III-V chip 10 (e.g., a hybrid silicon laser) is an optical source that is fabricated from both silicon and group III-V semiconductor materials, where the group III-V semiconductor materials may include, e.g., Indium (III) phosphide (V), gallium (III) arsenide (V), nitrogen (V), etc. A mode converter 16 is coupled to the III-V chip 10. In one case, the mode converter 16 may be identical to that required to couple a distributed feedback laser (DFB) with similar requirements for low insertion loss and reflection as understood by one skilled in the art. A mode converter 16 (also referred to as mode size converter) includes optical devices which allow for efficient coupling between modes of different sizes. A mode (size) converter (or mode size adapter) is an optical device which can be used for expanding or contracting a mode in the transverse spatial dimensions. For example, a mode converter could expand the very tiny mode of the waveguide in a laser diode to a size which fits to the mode of an optical fiber.

The mode converter 16 couples the III-V chip 10 to the waveguide 20. Although shown schematically as entirely external to the III-V chip 10, it is understood that mode converting components 16 may also include components, e.g. active or passive waveguide sections with different dimensions that the primary gain waveguide section, fabricated on the III-V chip 10. The waveguide 20 connects to various intra-cavity optical elements 120, 130, and 140 on the silicon chip 100 as understood by one skilled in the art. The order of the intra-cavity optical elements 120 and 130 shown is arbitrary and is not meant to be limiting. It is contemplated that either order of the intra-cavity optical elements 120 and 130 is possible. The intra-cavity optical elements 120, 130, 140 may be an external integrated photonic circuit 25 fabricated on the silicon substrate 30 of the silicon chip 100.

A laser cavity 24 is formed between the III-V gain chip 10 and the external integrated photonic circuit 25, specifically between the HR facet 12 and the band-reflect grating 140. To provide a basis for the following discussion, the magnitude of the dominant polarization of the electric field, E or modal amplitude, in the laser resonator will be described as a function of time, t, and longitudinal position, z. The coordinate system is defined such that the HR facet (element 12) of the III-V chip (element 10) is z=0. The expression for the modal amplitude can then be described by the function $E(\omega,z,t,T)=A_{forward}(z)\cdot e^{i(\omega t - k(\omega,z,T)z)}+A_{reverse}(z)\cdot e^{i(k(\omega,z,T)z-\omega t)}$. The real valued $A_{forward}(z)$ and $A_{reverse}(z)$ functions define the amplitude of the forward and backward propagating fields in the laser cavity subject to the loss and gain from the intra-cavity elements. Remaining variables are defined as follows: $\omega$ is the angular frequency of the optical mode of interest; T is the local temperature (i.e. rigorously T(z)); $k(\omega,z,T)$ is the wavevector of the optical mode of the given angular frequency, for the given longitudinal position and temperature. For clarity, the effects of reflections from intra-cavity elements are neglected and details associated with the phase change resulting from transmission through the intra-cavity filter are neglected. All intra-cavity elements are treated as waveguides with arbitrary $k(z,\omega,T)$ characteristics.

The laser cavity as defined then supports a continuum of longitudinal optical modes $\omega_0, \omega_1, \ldots \omega_m$ that are determined by the round-trip constructive interference condition of the resonator. As is well known within the field, this interference condition is satisfied when the accumulated optical phase of the round-trip propagation, $\varphi$, equals an integer multiple of $2\pi$. Using the above conventions and defining the position of effective reflection within the band-reflect grating 140 for the given modal angular frequency and local temperature as $z''(\omega,T)$, the round trip phase is given by:

$$\varphi(\omega, T) = 2\int_0^{z''(\omega, T)} k(\omega, z, T) z \, dz$$

To simplify the analysis, the case of uniform, frequency independent modal effective indices, $n_{III-V}(T)$ and $n_{Si}(T)$, will be considered for the III-V chip 10 and the silicon external cavity 25 respectively. The longitudinal coordinate for the interface between the III-V chip 10 and the silicon external cavity 25 is then defined as z' with the lengths of the two cavity halves as $L_{III-V}$ and $L_{Si}(T)$ respectively. The length of the silicon external cavity 25 is still considered temperature dependent in this analysis due to $z''(\omega,T)$, but the frequency dependence is ignored. The resulting round trip phase can then be expressed simply by expanding the wavevector in terms of the effective index, angular frequency and vacuum speed of light, c, as a function of position:

$$\varphi(\omega, T) = 2\frac{\omega}{c}\left(n_{III-V}(T)L_{III-V} + n_{Si}(T)L_{Si}(T)\right)$$

Enforcing the phase matching condition, the angular frequency of operating mode $\omega_m$ can then be expressed as:

$$\omega_m(T) = \frac{(m+1)\pi c}{n_{III-V}(T)L_{III-V} + n_{Si}(T)L_{Si}(T)}$$

Now, further details of the intra-cavity optical elements 120, 130, 140 in the external integrated photonic circuit 25 are discussed below in the context of the above influence on $\omega_m(T)$.

The intra-cavity optical element 120 is an intra-cavity transmission-mode optical band-pass filter 120 with a full-width half-maximum (FWHM) equal to or less than the free-spectral range of the cavity Fabry-Perot (F-P) resonances. The purpose of this filter is to provide operating longitudinal mode selection through loss discrimination such that the filter resonant frequency, $\omega_f$, is actively tuned to be centered on the desired $\omega_m$ while providing sufficient round-trip cavity loss discrimination for adjacent longitudinal modes $\omega_{m-1}$ and $\omega_{m-1}$ to prevent undesired modes from reaching lasing threshold and provide a sufficient side mode suppression ratio. The narrow bandwidth of the intra-cavity filter results in a reduction of laser output power proportional to the magnitude of difference, $\Delta\omega=|\omega_f-\omega m|$. This enables the output power of the laser to be monitored as a feedback parameter for matching the intra-cavity filter resonance frequency with the longitudinal operating mode through the active control of either mode.

The resonance frequency of the intra-cavity transmission-mode optical band-pass filter 120 is then held constant throughout laser operation (except startup initialization or where intentionally modulated) as a function of temperature through either an athermal design or active control. Examples of athermal design for the band-pass filter include modal thermo-optic coefficient compensation by varying waveguide widths and lengths in a silicon/silicon dioxide interferometer or introducing negative thermo-optic material cladding such as $TiO_2$ over a silicon nanowire ring resonator filter. Examples of active control include controlling integrated heater power based on a temperature sensor feedback signal.

In the case of low free-spectral range filters such as ring resonators, the intra-cavity transmission-mode optical band-pass filter 120 must also be designed such that the free-spectral range is greater than half of the FWHM reflection bandwidth of the band-reflect grating 140. This condition ensures that other longitudinal mode orders of the band-pass filter do not provide alternate low round-trip loss longitudinal laser cavity operating modes.

The intra-cavity optical element 130 is an active intra-cavity transmission-mode thermo-optic optical phase tuner element 130. The active intra-cavity transmission-mode thermo-optic optical phase tuner element 130 may include either a broad-band waveguide section or a narrow-band filter such as one or more ring resonator filters in an all-pass transmission phase control configuration. The active intra-cavity transmission-mode thermo-optic optical phase tuner element 130 is configured to adjust round-trip cavity phase to a constant value within the compensated temperature range of laser operation, e.g. 0° Celsius (C.)-85° C., based on the measured value of suitable feedback parameter such as laser output power. The active intra-cavity transmission-mode thermo-optic optical phase tuner element 130 provides active control of the round trip phase of the laser operating mode, $\varphi$, and this means that the active intra-cavity transmission-mode thermo-optic optical phase tuner element 130 requires power to control the phase. In the context of previous discussion of round trip cavity phase, the active phase tuner 130 of given length, $L_{tune}$, powered to an elevated temperature, $\Delta T_{tune}$, over the ambient temperature $T_{amb}$ controls the operating mode frequency to a constant value, $\omega_m'$, that is independent of $T_{amb}$ by adjusting $\Delta T$ through the effective thermo-optic coefficient of the tuner, $$\frac{dn_{tune}}{dT}: \omega_m' = \frac{(m+1)\pi c}{n_{III-V}(T_{amb})L_{III-V} + n_{Si}(T_{amb})L_{Si}(T_{amb}) + \Delta T_{tune}\frac{dn_{tune}}{dT}L_{tune}}.$$

The intra-cavity optical element 140 is a band-reflect grating with passive phase compensation that is the laser output coupler while reducing the net round trip phase change as a function of temperature. The relevant design range for the in-band reflectance is between 5% and 80%. As discussed for element 120, full-width half-maximum (FWHM) reflectance bandwidth of the band-reflect grating with passive phase compensation 140 must be less than double the free-spectral range of the band-pass optical filter 120.

The passive phase compensation properties of the band-reflect grating 140 is accomplished by designing the temperature dependence of the effective mirror position, $z''(\omega, T)$, to result in a shorter effective silicon cavity length, $L_{Si}(T)$, with increasing temperature to compensate for the positive effective thermos-optic coefficients of the III-V and silicon waveguides, $$\frac{dn_{III-V}}{dT} \text{ and } \frac{dn_{Si}}{dT}$$

respectively. The desired design condition is then:

$$-\frac{dL_{Si}}{dT}n_{Si} \approx \frac{dn_{Si}}{dT}L_{Si} + \frac{dn_{III-V}}{dT}L_{III-V}$$

This design methodology bounds the round trip phase of the desired laser longitudinal operating mode to within a small total phase change range for a specific designed operating temperature range. Continuous single-mode operation requires that the remaining round trip phase change is within the control range of the active intra-cavity transmission-mode thermo-optical phase tuner 130, e.g. $4\pi$, over the compensated temperature range of laser operation, e.g. 0° C.-85° C. Assuming that the cavity round trip phase change is monotonic with temperature, the example case can then be expressed as:

$|\varphi(\omega_m, 85° C.) - \varphi(\omega_m, 0° C.)| < 4\pi$

The design of the passive phase compensation can be understood through the temperature dependence of the grating's effective mirror position and therefore $L_{Si}$ z"($\omega_m$,T). For a uniform grating, the effective mirror position from the input of the grating, $L_{eff}(\omega,T)$, can be written in terms of the coupling strength, $\kappa(\omega,T)$, and total grating length $L_g$ as:

$$L_{eff}(\omega, T) = \frac{1}{2\kappa(\omega, T)} \tanh[\kappa(\omega, T) L_g]$$

For the simplest form of thermal compensation, the coupling strength temperature dependence can $\kappa(\omega,T)$ maximized such that the effective grating length is reduced to compensate for the positive thermo-optic coefficient of the rest of the laser cavity. This level of compensation may be sufficient for short laser cavities with strongly reflecting gratings.

Stronger compensation of the net cavity thermo-optic coefficient can be achieved with properly designed chirped gratings. In a chirped grating, the effective index, n, and the grating pitch, $\Lambda$, can be varied as a function of position. For a given frequency, $\omega$, the grating pitch that results in maximum reflectance, $\Lambda^{max}(\omega,n)$, is approximately:

$$\Lambda^{max}(\omega, n) = \frac{\pi c}{\omega \cdot n}$$

The design of a linear chirped grating for passive phase compensation of the round trip cavity phase is considered in the context of the previous variable definitions. The effective index in the grating will be approximated as constant and equal to the unperturbed silicon cavity, $n_{Si}(T)$. The grating pitch as a function of position will then be written in terms of a chirp rate, $$\frac{d\Lambda}{dz},$$

and central pitch corresponding to the maximum reflectance condition for the nominal operating mode, $\omega_m$, at reference temperature $T_0$:

$$\Lambda(z) = \frac{d\Lambda}{dz}\left(z - \frac{L_g}{2}\right) + \Lambda^{max}(\omega_m, n_{Si}(T_0))$$

To simplify the analysis, we can treat the effective mirror position as being defined as the point where the grating pitch maximizes the reflectance for the operating mode angular frequency $\omega_m$ at temperature T. We are then interested in obtaining the resulting change in silicon cavity length, $L_{Si}$, with temperature that this effect can provide. Substituting variables from the previous equations, taking the derivative with respect to temperature and neglecting higher order terms, we can obtain the following relation:

$$\frac{dL_{Si}}{dT} \approx -\left(\frac{\pi c}{\omega_m n_{Si}^2(T_0)}\right)\frac{dn_{Si}/dT}{d\Lambda/dz}$$

Utilizing the previous design criteria for the passive thermo-optic phase compensation criteria to enable thermally-insensitive laser operation, the required grating chirp parameter can then be approximated as:

$$\frac{d\Lambda}{dz} \approx \frac{\left(\frac{\pi c}{\omega_m n_{Si}(T_0)}\right) dn_{Si}/dT}{L_{Si} dn_{Si}/dT + L_{III-V} dn_{III-V}/dT}$$

This approximate chirp parameter is derived and provided to provide a concrete design example but is not the rigorous criteria for the disclosed laser cavities. Both the coupling and effective index temperature dependences must be considered to choose the correct chirp parameter. Generally, the required chirp parameter results in a "red-chirped" grating such that $d\Lambda/dz$ is a positive value. It should be noted that this criteria is opposite to traditional external cavity chirped grating designs that choose a negative $d\Lambda/dz$ to improve noise characteristics. The disadvantage of a positive $d\Lambda/dz$ chirp design in this configuration is mitigated by the large longitudinal laser cavity mode free spectral ranges enabled by the compact integrated cavity design.

The laser beam (output) of the laser system on the silicon chip 100 is monitored by a power monitor 18. The power monitor 18 is coupled to the waveguide 20. Power monitoring in the laser system on silicon chip 100 is utilized for control of the intra-cavity phase, to maintain efficient single-mode operation, for error-free link operation, and for using the laser across the operating temperature (e.g., 0-85° C.). The power monitor 18 can be intra-cavity (i.e., in the laser cavity 24) and/or after the output coupler band-reflect grating with passive phase compensation 140. In one case, having the power monitor 18 after the output coupler band-reflect grating with passive phase compensation 140 but prior to any other integrated system components is the better implementation (but is not a necessity). The power monitor 18 can be a normal detector that is butt coupled to a small tap, e.g., 1% directional coupler, from the output waveguide 20, and/or an inline power detector such as a lateral silicon PIN diode that collects photogenerated carriers from defect state absorption.

Figure 2:
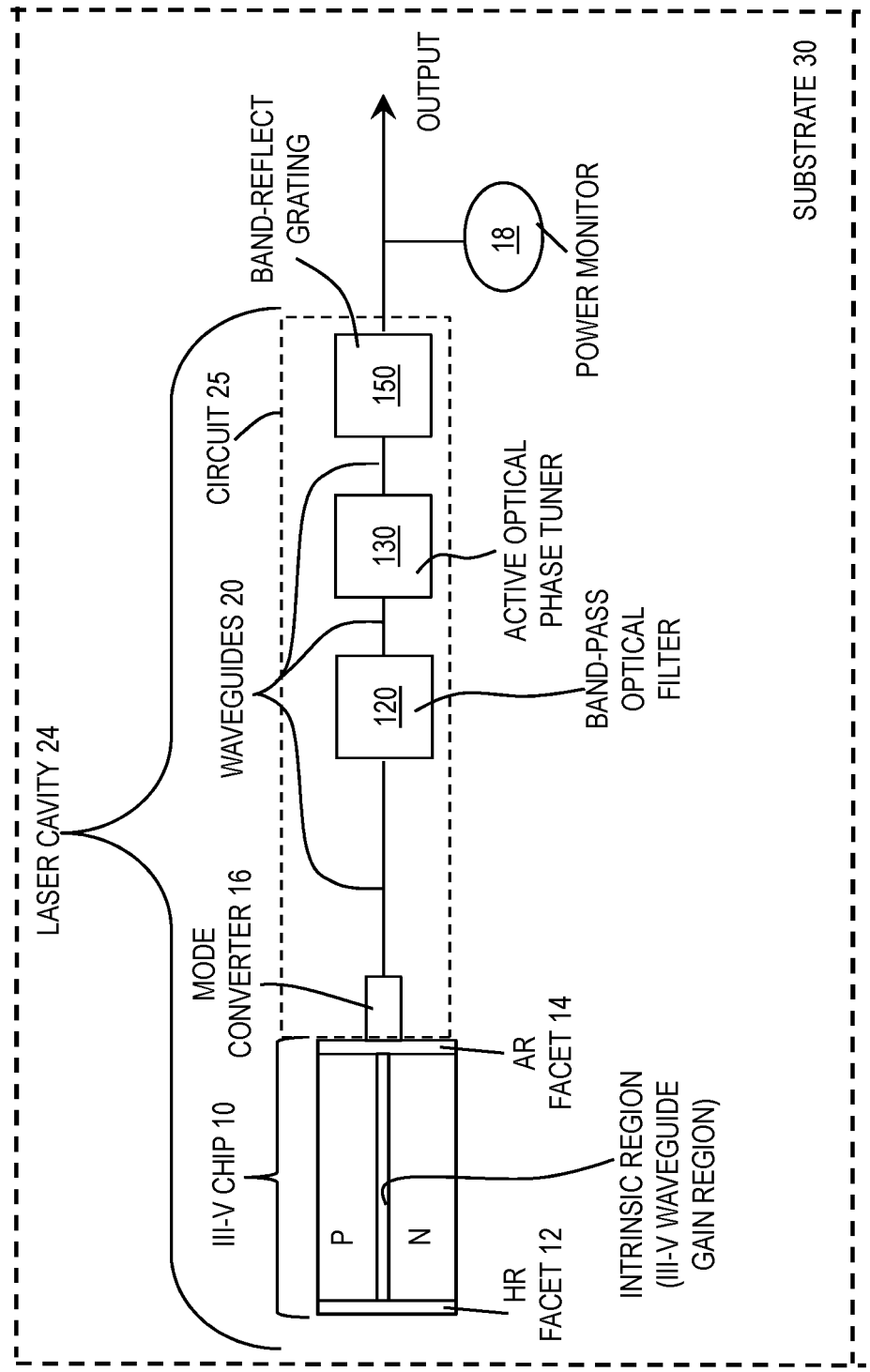
FIG. 2 illustrates a single frequency cavity diagram of a laser on a silicon chip according to an embodiment.

FIG. 2 illustrates the single frequency cavity diagram of the laser on the silicon chip 100 according to another embodiment. The single frequency cavity diagram of the laser on the silicon chip 100 in FIG. 2 is identical to FIG. 1 except that the passive intra-cavity optical phase compensation characteristic of the band-reflect grating with passive phase compensation 140 is omitted such that the laser output coupler grating is defined by a standard band-reflect grating 150 with all other reflectance characteristics shared with element 140.

As noted above in FIG. 1, the silicon chip 100 in FIG. 2 includes the intra-cavity transmission-mode optical bandpass filter 120 with a full-width half-maximum (FWHM) equal to or less than double the free-spectral range of the cavity Fabry-Perot (F-P) resonances, the active intra-cavity transmission-mode thermo-optic optical phase tuner element 130, the output coupler band-reflect grating optical filter 140 with an in-band reflectance in the range between 10% and 50% and a full-width half-maximum (FWHM) bandwidth equal to or greater than double the free-spectral range of the band-pass optical filter 120. The laser beam (output) of the laser system on the silicon chip 100 is monitored by a power monitor 18. Since the passive intra-cavity optical phase compensation characteristic of the band-reflect grating with passive phase compensation 140 is omitted in FIG. 2, the silicon chip 100 in FIG. 2 has to place all of its reliance to maintain the same phase φ in the active intra-cavity transmission-mode thermo-optic optical phase tuner element 130, which means that more power is required to maintain the phase of the laser beam.

A transmission function is the product of the intra-cavity transmission-mode optical band-pass filter 120 and Fabry-Perot (F-P) cavity. The transmission function is formally the amplitude and phase characteristic for various optical frequencies of a single output mode given a unity amplitude and phase input mode. Alternatively, the transmission function can be defined as the Fourier transform of the transient impulse response of the optical system for the various input and output modes of interest.

For single-mode operation with good side-mode suppression ratio, FWHM of the intra-cavity transmission-mode optical band-pass filter 120 should be less than the Fabry-Perot (F-P) free spectral range (FSR). A lower ratio (between the intra-cavity transmission-mode optical band-pass filter 120 and Fabry-Perot free spectral range (FSR)) is better. The free spectral range (FSR) is the spacing in optical frequency or wavelength between two successive reflected or transmitted optical intensity maxima or minima of an interferometer or diffractive optical element.

In traditional tunable lasers, the cavity length is adjusted while moving the intra-cavity filter wavelength (such as by turning a diffraction grating) to match the F-P and filter mode. Failure to synchronously adjust the two (the cavity length and the intra-cavity filter wavelength) results in mode-hopping or multi-mode operation.

As noted herein, temperature changes cause the wavelength/phase of the laser beam to change. In accordance with embodiments, temperature insensitive laser operation is provided by cavity design and/or active control. The intra-cavity transmission-mode optical band-pass filter 120 wavelength is held constant throughout operation (outside of laser startup initialization) through active control (active intra-cavity transmission-mode thermo-optic optical phase tuner element 130) and/or athermal design (the passive intra-cavity optical phase compensation characteristic of the band-reflect grating with passive phase compensation 140). The peak transmission angular frequency of the intra-cavity filter, $\omega_f$, is then considered to be constant throughout operation and independent of ambient temperature. The lasing mode of the Fabry-Perot cavity (i.e., laser cavity 24) is locked to the intra-cavity transmission-mode optical band-pass filter 120 through active control of the intra-cavity phase within the compensated round-trip phase range across temperature by maximizing output power as measured by intra-cavity or extra-cavity optical power monitor 18. This can be understood by considering the transmission ratio, TR, between the optical band-pass filter transmissions of intra-cavity filter at the resonance angular frequency, $T_{filter}(\omega_f)$, and at the angular frequency of the operating laser mode, $T_{filter}(\omega_m)$:

$$TR = \frac{T_{filter}(\omega_f)}{T_{filter}(\omega_m)}$$

Since any value of TR greater than 1 results in a reduction in the laser output power relative to the case where $\omega_m=\omega_f$, which is the desired operating condition for a stabilized laser operating frequency that is temperature independent. Ensuring a less than 1:1 ratio of the filter FWHM (in the intra-cavity transmission-mode optical band-pass filter) to Fabry-Perot mode spacing (FSR) guarantees a strong output power dependent error-signal for robust control of intra-cavity phase. This condition also ensures that the TR of $\omega_m$ is always less than the TR for $\omega_{m-1}$ or $\omega_{m+1}$ for TR<2, ensuring that the feedback loop has a sufficiently large error signal to continuously control operation in a single longitudinal mode of the laser cavity over the operating temperature range. Based on monitoring the power monitor 18, the active intra-cavity transmission-mode thermo-optic optical phase tuner element 130 adjusts the phase of the light in the laser cavity 24 and therefore controls $\omega_m$ as described by equation 53. The lasing wavelength can then be maintained throughout the temperature range of operation without undergoing changes of the Fabry-Perot mode order (i.e., without mode hops) to maintain error-free link operation.

Note that sub-headings are provided below for ease of understanding and not limitation.

Passive Thermo-Optic Phase Compensation

FIG. 3A illustrates a graph 300 showing how the III-V gain region (of the III-V chip 10) changes the phase of the laser beam with a change in operating temperature. As a result of an increase in temperature on the substrate 30, there is an increase in phase (i.e., phase change) in III-V gain region waveform 302 and an increase in phase (i.e., phase change in a state-of-the-art silicon passive cavity result in a waveform 305. Both waveforms 302 and 305 show an increase in phase with an increase in temperature of the silicon chip 100. However, the passive phase compensation waveform 310 of the passive intra-cavity optical phase compensation characteristic of the band-reflect grating with passive phase compensation 140 is passively configured to compensate for the phase change by the III-V gain region (of the III-V chip 10) and compensates for the resulting typical silicon passive cavity phase change (of waveform 305). A state-of-the-art system would require active phase control (i.e., outside power) to compensate for the increase in phase shown in FIG. 3A but FIG. 1 does not (necessarily) require active phase control although active intra-cavity transmission-mode thermo-optic optical phase tuner element 130 can be (optionally) utilized. Even when active intra-cavity transmission-mode thermo-optic optical phase tuner element 130 is utilized in the silicon chip 100 in FIG. 1, less power is required by the active intra-cavity transmission-mode thermo-optic optical phase tuner element 130 because the passive intra-cavity optical phase compensation characteristic of the band-reflect grating with passive phase compensation 140 compensates for the phase change.

FIG. 3B illustrates a schematic of the passive intra-cavity optical phase compensation characteristic of the band-reflect grating with passive phase compensation 140 with details of the passive thermo-optic phase compensation according to embodiments. In one case, the passive intra-cavity optical phase compensation characteristic of the band-reflect grating with passive phase compensation 140 may be a distributed reflector grating that has smaller pitch on the left side to compensate for the increase in phase (of the light)

corresponding to the increase in temperature of the silicon chip 100. The left side of the band-reflect grating with passive phase compensation 140 is closer to the III-V chip 10 and pointed to the III-V chip 10, while the right side is further away from the III-V chip 10. The pitch (linearly and/or gradually) increases from left to right (smaller pitch to wider pitch), such that the wider pitch on the right side compensates for the decrease in phase corresponding to the decrease in temperature (of the silicon chip 100). Accordingly, as the temperature increases and/or decreases (within the operation temperature (e.g., 0-85° C.) on the substrate 30 of the silicon chip 100, there is a corresponding pitch variation (from small pitch through wide pitch) to match the change in phase/wavelength in the passive intra-cavity optical phase compensation characteristic of the band-reflect grating with passive phase compensation 140. The smaller pitch on the left side reflects the light with the high temperature (higher phase and smaller wavelength), while the wider pitch on the right side reflects the light with the lower temperature (lower phase and longer wavelength).

Intra-Cavity Filters

Figure 4:
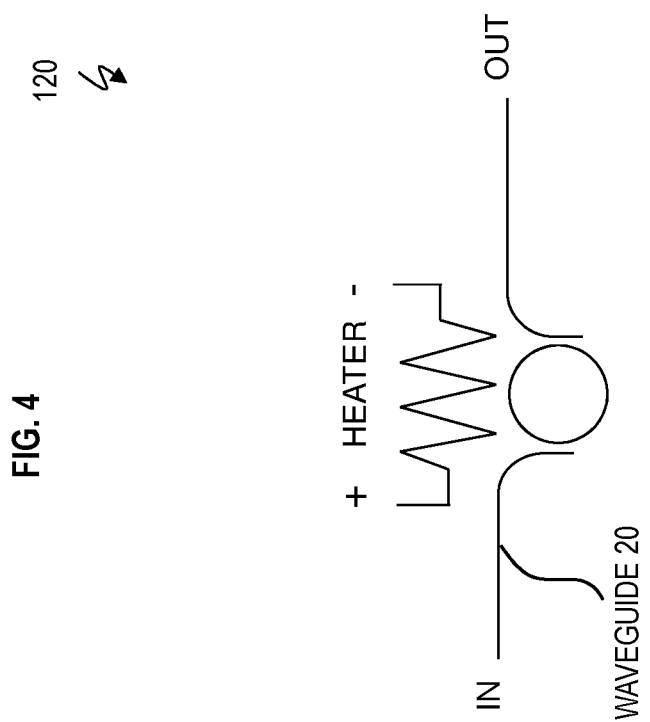
FIG. 4 illustrates an example intra-cavity transmission-mode optical band-pass filter according to an embodiment.

FIG. 4 illustrates an example intra-cavity transmission-mode optical band-pass filter 120 according to an embodiment. In one implementation, the intra-cavity transmission-mode optical band-pass filter 120 may be any configuration of a ring-resonator, such as a Mach-Zehnder and/or grating transmission-mode filter with appropriate free-spectral range (FSR) and bandwidth suitable for laser cavity construction. In this implementation, FIG. 4 shows the ring-resonator with connected waveguide 20 for input and output of the light. The ring-resonator has a heater (e.g., a resistor or resistive element) that receives power in order to control the temperature of the ring-resonator. The filter resonance frequency of the ring-resonator is to be maintained throughout laser operation. In the example intra-cavity transmission-mode optical band-pass filter 120, FIG. 4 shows a front-up approach which is a first-order ring resonator filter that is thermally controlled (thus controlling the ring resonance frequency) to a constant temperature above the maximum designed operation ambient temperature of the laser system in the silicon chip 100.

A ring-resonator, also referred to as an optical ring resonator, is a set of waveguides in which at least one is a closed loop coupled to some sort of light input and output. These can be, but are not limited to being, waveguides. The concepts behind optical ring resonators use light and obey the properties behind constructive interference and total internal reflection. When light of the resonant wavelength/frequency is passed through the loop from input waveguide, the light builds up in intensity over multiple round-trips due to constructive interference and is output to the output bus waveguide which serves as a detector waveguide. Because only a select few wavelengths will be at resonance within the loop, the optical ring resonator functions as a filter. Additionally, two or more ring waveguides can be coupled to each other to form an add/drop optical filter.

Active Round-Trip Phase Control

Figure 5:
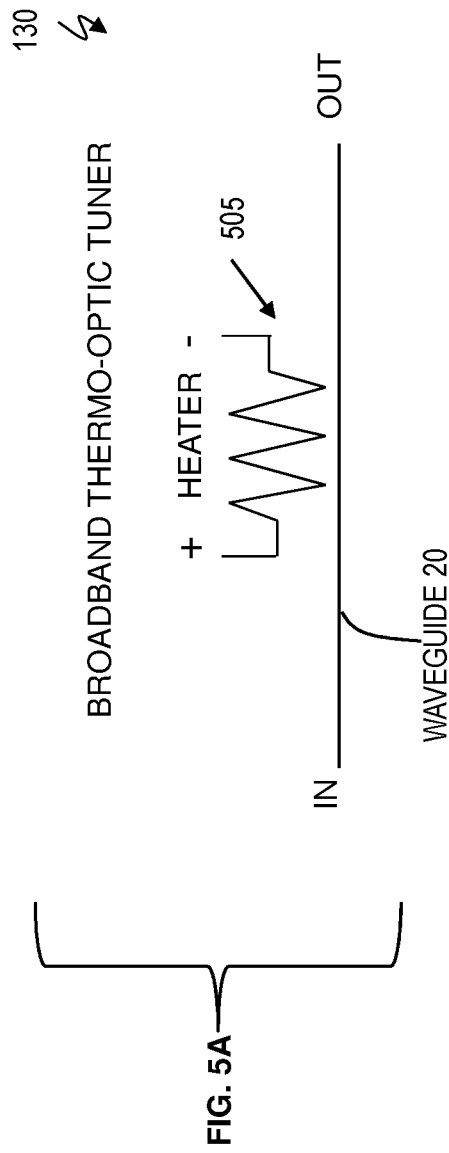
FIG. 5A illustrates an implementation of an active intra-cavity transmission-mode thermo-optic optical phase tuner element as a broadband thermo-optic tuner according to an embodiment.
FIG. 5B illustrates another implementation of the active intra-cavity transmission-mode thermo-optic optical phase tuner element as narrowband thermo-optic tuners according to an embodiment.

FIGS. 5A and 5B show two different examples of the active intra-cavity transmission-mode thermo-optic optical phase tuner element 130 according to an embodiment. Although examples are provided, any method of phase control is suitable if the total range is approximately (~) 4π.

FIG. 5A illustrates an implementation (which may be preferred but is not a necessity) of the active intra-cavity transmission-mode thermo-optic optical phase tuner element 130 as a broadband thermo-optic tuner because the zero amplitude response and ease of control of broadband thermo-optic tuner. The broadband thermo-optic tuner has a waveguide 20 in which the light travels in and out, and a heater 505. Current can be applied to the heater 505 to actively control the round-trip phase.

FIG. 5B illustrates another implementation of the active intra-cavity transmission-mode thermo-optic optical phase tuner element 130 as narrowband thermo-optic tuners (ring-resonator all-pass filters). The narrowband thermo-optic tuners are suitable as well, but add complexity for resonance frequency control. The narrowband thermo-optic tuners show a waveguide 20 with two ring-resonators 510, and each ring-resonator has a heater 505 to control the bandwidth.

Note also that carrier-injection tuners can be utilized either in the silicon cavity and/or in the III-V die, but the carrier-injection tuner adds complexity of amplitude fluctuations.

Reflectors

Figure 6:
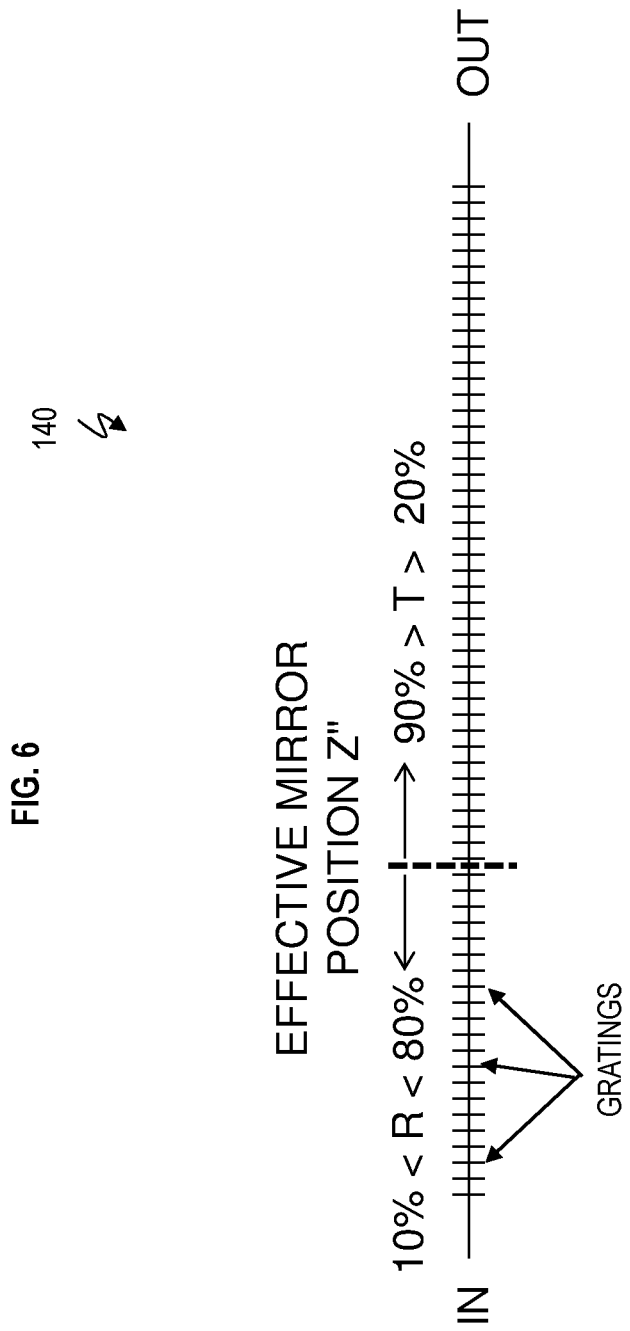
FIG. 6 illustrates an example output coupler band-reflect grating optical filter according to an embodiment.

FIG. 6 illustrates an example output coupler band-reflect grating optical filter 140 according to an embodiment. In one implementation, the output coupler band-reflect grating optical filter 140 may be a standard sidewall grating (partially etched or fully etched), which is a suitable output coupler for basic laser operation with in-band reflectance between 10% and 50%. The in-band reflectance of the sidewall grating is determined by III-V current-gain characteristic (of the III-V chip 10), passive cavity loss, coupling efficiency, and output power.

The bandwidth of the sidewall grating can be designed to have at least a 1 decibel (dB) suppressed reflectance for non-lasing filter order peaks (e.g., the peaks may be greater than (>) 3 dB in one case) in configurations without a compound intra-cavity filter characteristic that otherwise suppresses alternate filter order transmittance. Using the sidewall grating, compensation of the round-trip cavity phase with reduction in effective cavity length as a function of increasing temperature is included.

Mode Converter

Figure 7:
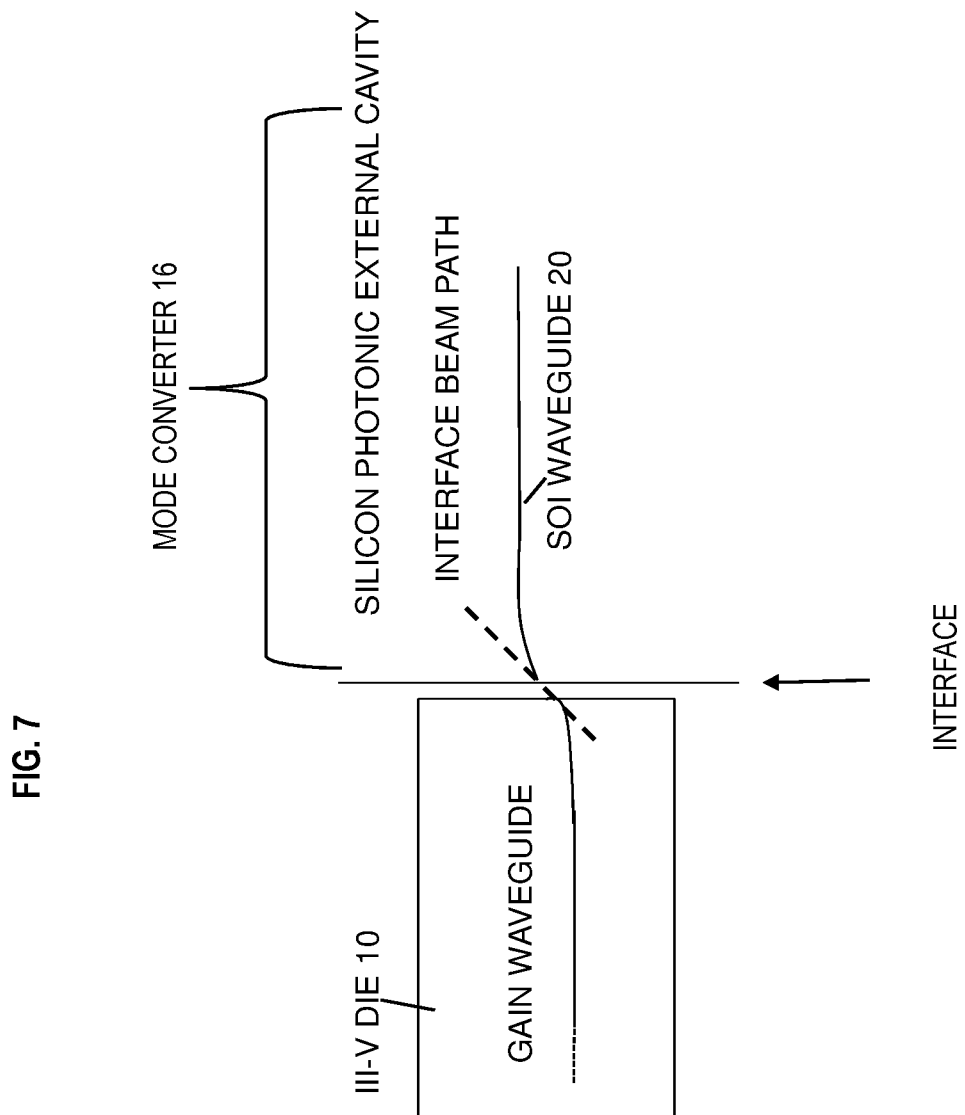
FIG. 7 illustrates an example of a mode converter according to an embodiment.

FIG. 7 illustrates an example of the mode converter 16 according to embodiment. Any standard laser to silicon-on-insulator (SOI) waveguide mode coupler and packaging strategy can be applied. Requirements of efficiency and reflectance are tied together in a requirement for stable single-mode operation. Ideal reflectance of $1e^{-5}$ (achievable through angled facet interface) may be relaxed to as high as 1% in highly efficient coupling schemes that allow the III-V die 10 HR back coating facet 12 and the output coupler band-reflect grating optical filter 140 (e.g., output coupler grating) to dominate the cavity Fabry-Perot characteristic.

Power Monitors

Figure 8:
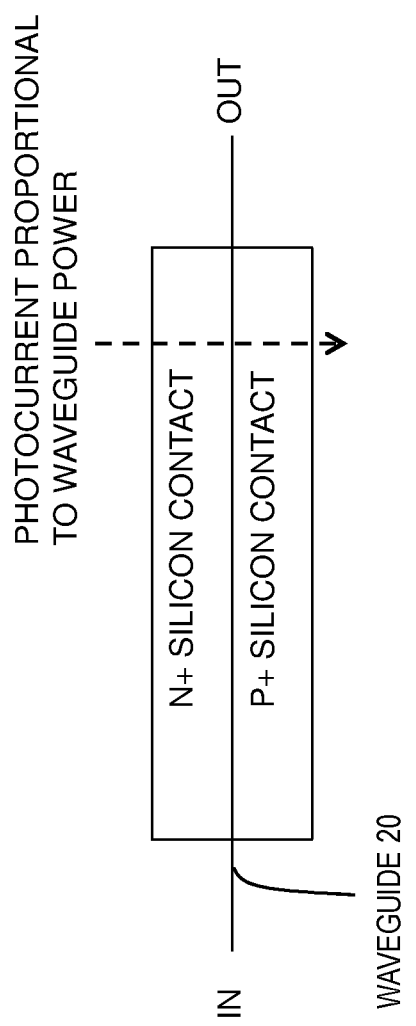
FIG. 8 illustrates an example implementation of a power monitor according to an embodiment.

FIG. 8 illustrates an example implementation of the power monitor according to an embodiment. The power monitor 18 may have an N+ doped silicon contact connected to a P+ doped silicon contact. The waveguide 20 connects laterally through the power monitor 18. Photocurrent proportional to the waveguide power (i.e., light beam) is generated in the power monitor 18, and the photocurrent flow perpendicular to the waveguide 20.

Power monitoring by the power monitor 18 in the laser system is important for control of the intra-cavity phase to maintain efficient single-mode operation for error-free link operation using the proposed laser across operating temperatures.

The power monitor 18 can be intra-cavity and/or after the output coupler band-reflect grating optical filter 140 (i.e., output coupler grating). Positioning the power monitor 18 after the output coupler band-reflect grating optical filter 140 but prior to any other integrated system components may be the better implementation (but is not a necessity).

The power monitor 18 can be a normal detector that is butt coupled to a small tap, e.g., 1% directional coupler, from the output waveguide 20, and/or an inline power detector such as a lateral silicon PIN diode that collects photogenerated carriers from defect state absorption.

Figure 9:
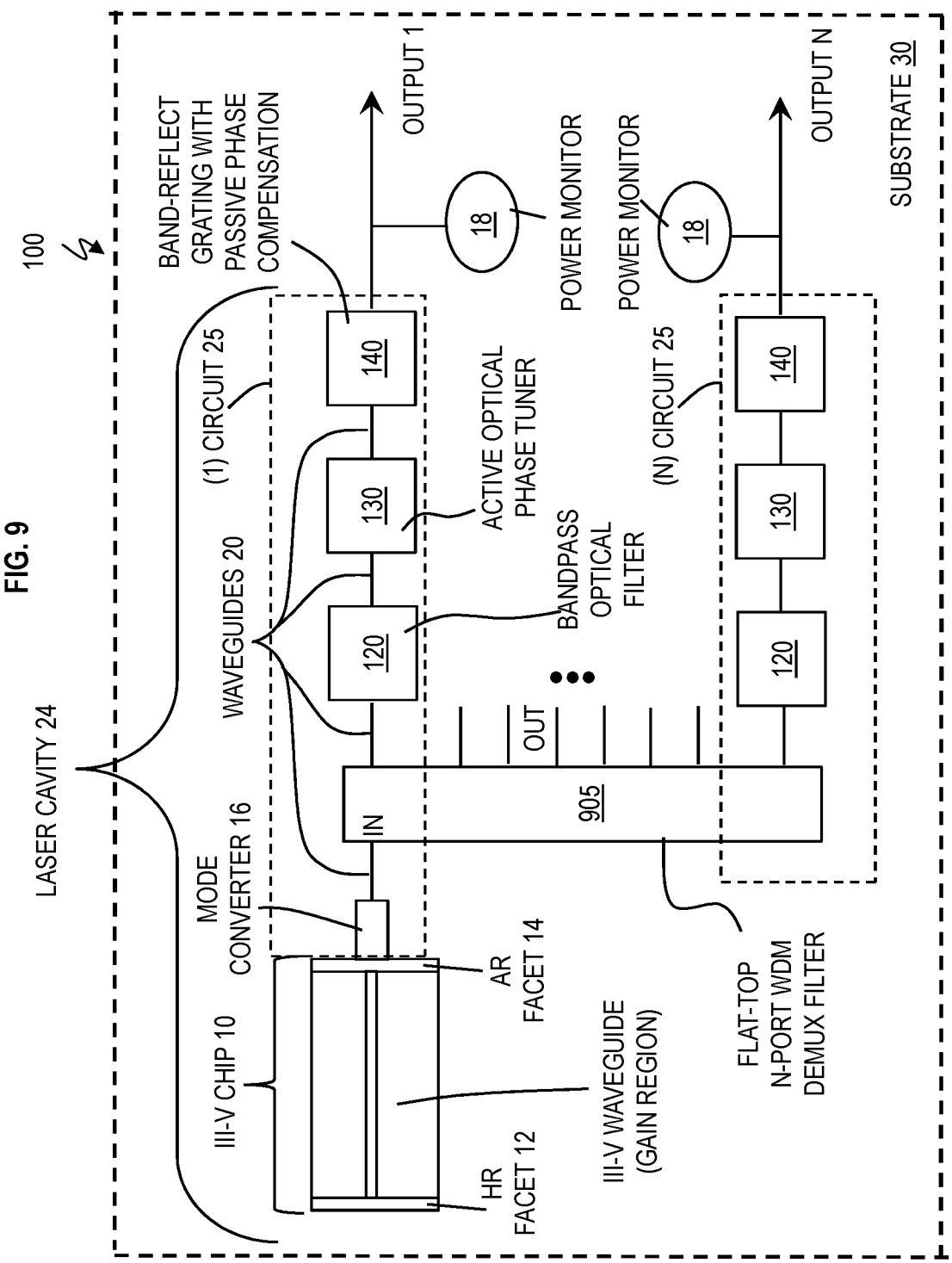
FIG. 9 illustrates a multi-frequency diagram of a laser on the silicon chip according to an embodiment.
Figure 10:
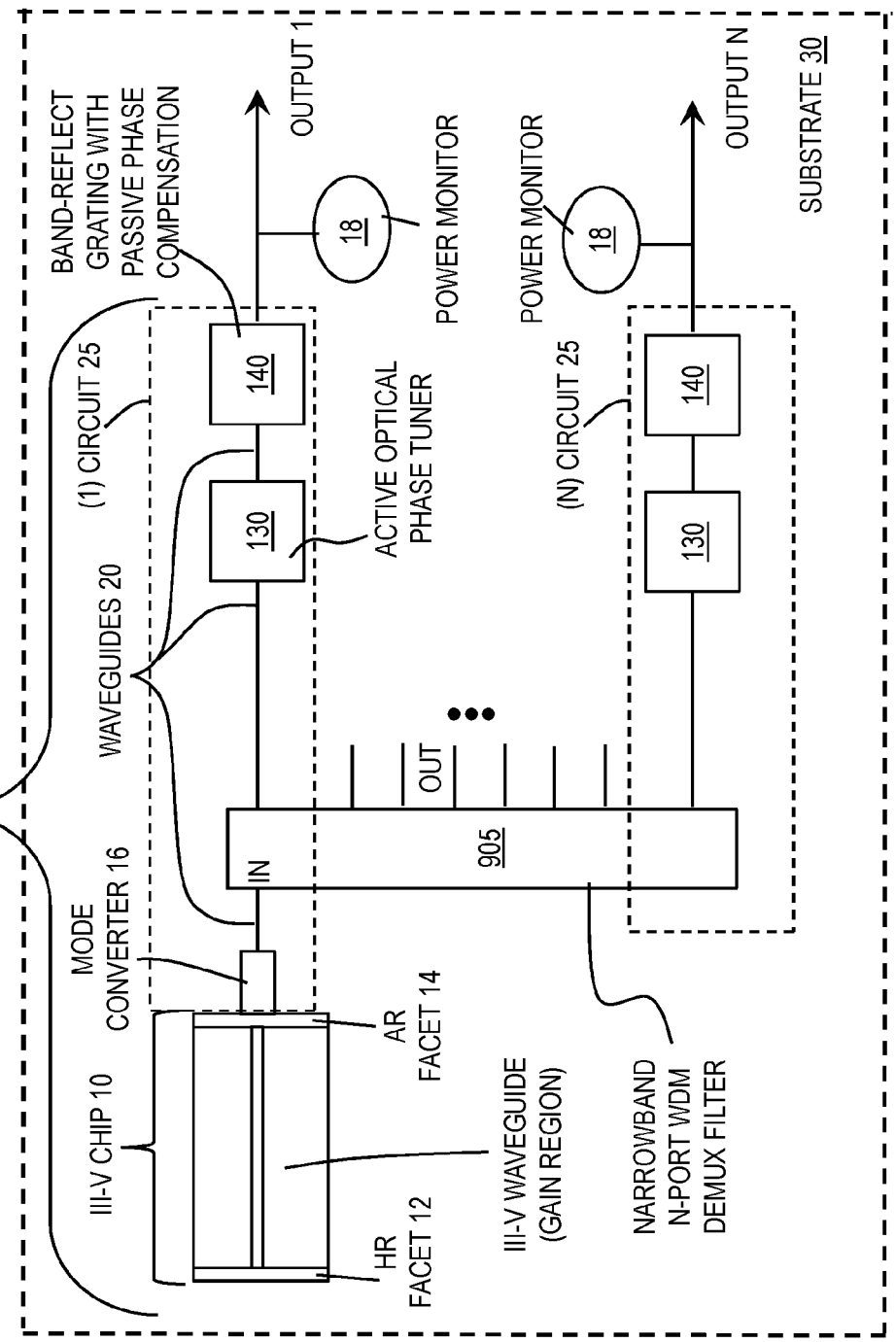
FIG. 10 illustrates another multi-frequency diagram of a laser on the silicon chip according to an embodiment.

Now, moving away from the sub-headings, multi-wavelength operation is discussed in FIGS. 9 and 10. Multi-wavelength operation may employ N-port demultiplexer filters, such as Mach-Zehnder interferometer (MZI) CWDM filters developed by MZI for transceiver applications.

FIG. 9 illustrates a multi-frequency diagram of a laser on the silicon chip 100 according to an embodiment. In FIG. 9, the silicon chip 100 now includes a coarse N-port wavelength division multiplexing (WDM) demultiplexing filter 905 positioned (directly) after the mode converter 16. The input port (IN) of the coarse N-port WDM demultiplexing filter 905 connects to the mode converter 16 to receive the light, and the output ports (OUT) of the coarse N-port WDM demultiplexing filter 905 connect to their respective 1-N integrated photonic circuits 25. As can be seen there are multiple output ports. For example, the coarse N-port WDM demultiplexing filter 905 may receive light at different wavelengths at the input side from the mode converter 16, such that the coarse N-port WDM demultiplexing filter 905 demultiplexes (separates) the light by wavelength and outputs light of each wavelength to an individual output port. The output ports are connected to the circuits 25, and the 1-N circuits 25 each include the intra-cavity transmission-mode optical band-pass filter 120, the active intra-cavity transmission-mode thermo-optic optical phase tuner element 130, and the band-reflect grating with passive phase compensation element 140. In this case, silicon chip 100 is configured to output multiple light beams with each at a different wavelength.

Turning to FIG. 10, another multi-frequency diagram of a laser on the silicon chip 100 according to an embodiment. FIG. 10 is similar to FIG. 9 except that the intra-cavity transmission-mode optical band-pass filter 120 is omitted because the coarse N-port WDM demultiplexing filter 905 is sufficiently narrowband to eliminate the need for a separate optical band-pass filter 120. In FIG. 10, the coarse N-port WDM demultiplexing filter 905 is now a narrowband N-port WDM demultiplexing filter that meets all the previously described parameters of the intra-cavity transmission-mode optical band-pass filter 120. FIG. 10 is a multi-frequency diagram of the laser shown in FIG. 2, and the silicon chip 100 now includes the narrowband N-port wavelength division multiplexing (CWDM) demultiplexing filter 905 positioned (directly) after the mode converter 16. As noted above, the input port of the narrowband N-port WDM demultiplexing filter 905 connects to the mode converter 16 to receive the light, and the output ports of the coarse N-port WDM demultiplexing filter 905 connect to their respective 1-N circuits 25. For example, the narrowband N-port WDM demultiplexing filter 905 may receive light at different wavelengths at the input side from the mode converter 16, such that the narrowband N-port WDM demultiplexing filter 905 demultiplexes (separates) the light by wavelength and outputs light of each wavelength to an individual output port. The output ports are connected to the circuits 25, and the 1-N circuits 25 each include the active intra-cavity transmission-mode thermo-optic optical phase tuner element 130 and the output coupler band-reflect grating optical filter 140. In this case, silicon chip 100 is configured to output multiple light beams with each at a different wavelength.

Besides having the narrowband N-port WDM demultiplexing filter 905 included and removing the intra-cavity transmission-mode optical band-pass filter 120, the silicon chip 100 in FIG. 10 operates as discussed in FIG. 1.

Figure 11:
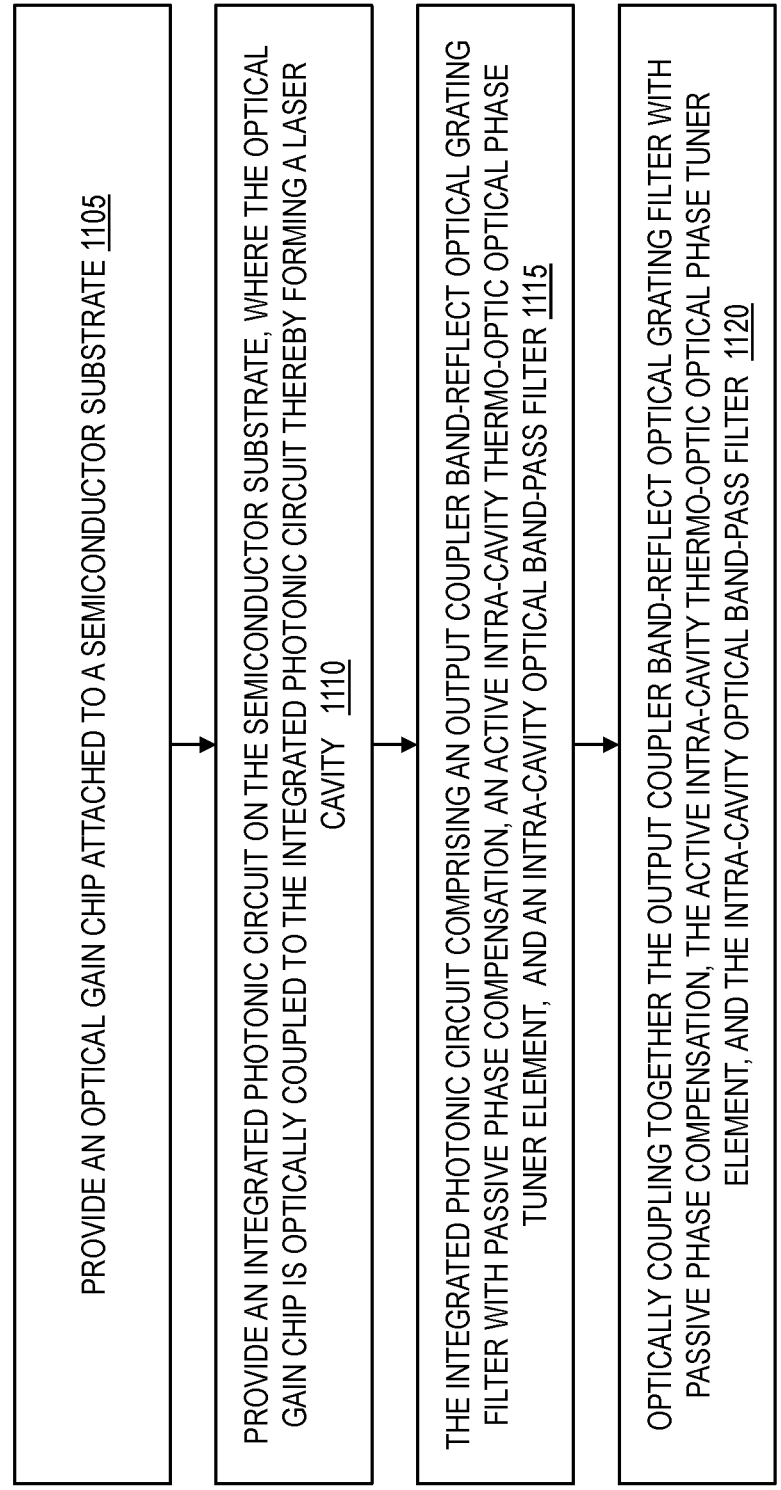
FIG. 11 illustrates a method of configuring the semiconductor chip according to an embodiment.

FIG. 11 illustrates a method 1100 of configuring the semiconductor chip 100 according to an embodiment. Reference can be made to FIGS. 1, 2, 9, and 10. At block 1105, the optical gain chip 10 is attached to a semiconductor substrate 30.

At block 1110, the integrated photonic circuit 25 is provided on the semiconductor substrate 30, and the optical gain chip 10 optically coupled to the integrated photonic circuit 25 forms the laser cavity 24.

At block 1115, the integrated photonic circuit 25 comprises the output coupler band-reflect optical grating filter with passive phase compensation 140, the active intra-cavity thermo-optic optical phase tuner element 130, and the intra-cavity optical band-pass filter 120.

At block 1120, the output coupler band-reflect optical grating filter with passive phase compensation 140, the active intra-cavity thermo-optic optical phase tuner element 130, and the intra-cavity optical band-pass filter 120 are optically coupled together.

The mode converter 16 is coupled between the optical gain chip 10 and the integrated photonic circuit 25. The output coupler band-reflect optical grating filter with passive phase compensation 140 is configured to reduce a net round trip phase change to within $4\pi$ over a temperature range. The temperature range is 0-85° Celsius.

The output coupler band-reflect optical grating filter with passive phase compensation 140 comprises a distributed reflector grating element (e.g., as shown in FIG. 3). The distributed reflector grating element has a smaller pitch at a first end and a wider pitch at the second end. The distributed reflector grating element is configured to shorten an effective cavity (length) of the laser cavity 24 with increasing temperature through increased index contract. The distributed reflector grating element has an elongated direction (e.g., length) and a width direction. The distributed reflector grating element changes in pitch along the elongated direction (e.g., length) such that the distributed reflector grating element varies from the smaller pitch at the first end and increases to the wider pitch at the second end.

When the N-port demultiplexing filter 905 is included the silicon chip 100, the silicon chip 100 includes output coupler band-reflect optical grating filter with passive phase compensation 140 (as shown in FIGS. 9 and 10). Although FIGS. 9 and 10 show different implementations. The N-port demultiplexing filter 905 is configured to provide different wavelengths of light to individual ones of the plurality of (1-N) integrated photonic circuits 25. In FIGS. 9 and 10, the mode converter 16 is coupled between the optical gain chip 10 and the coarse N-port WDM demultiplexing filter 905.

Figure 12:
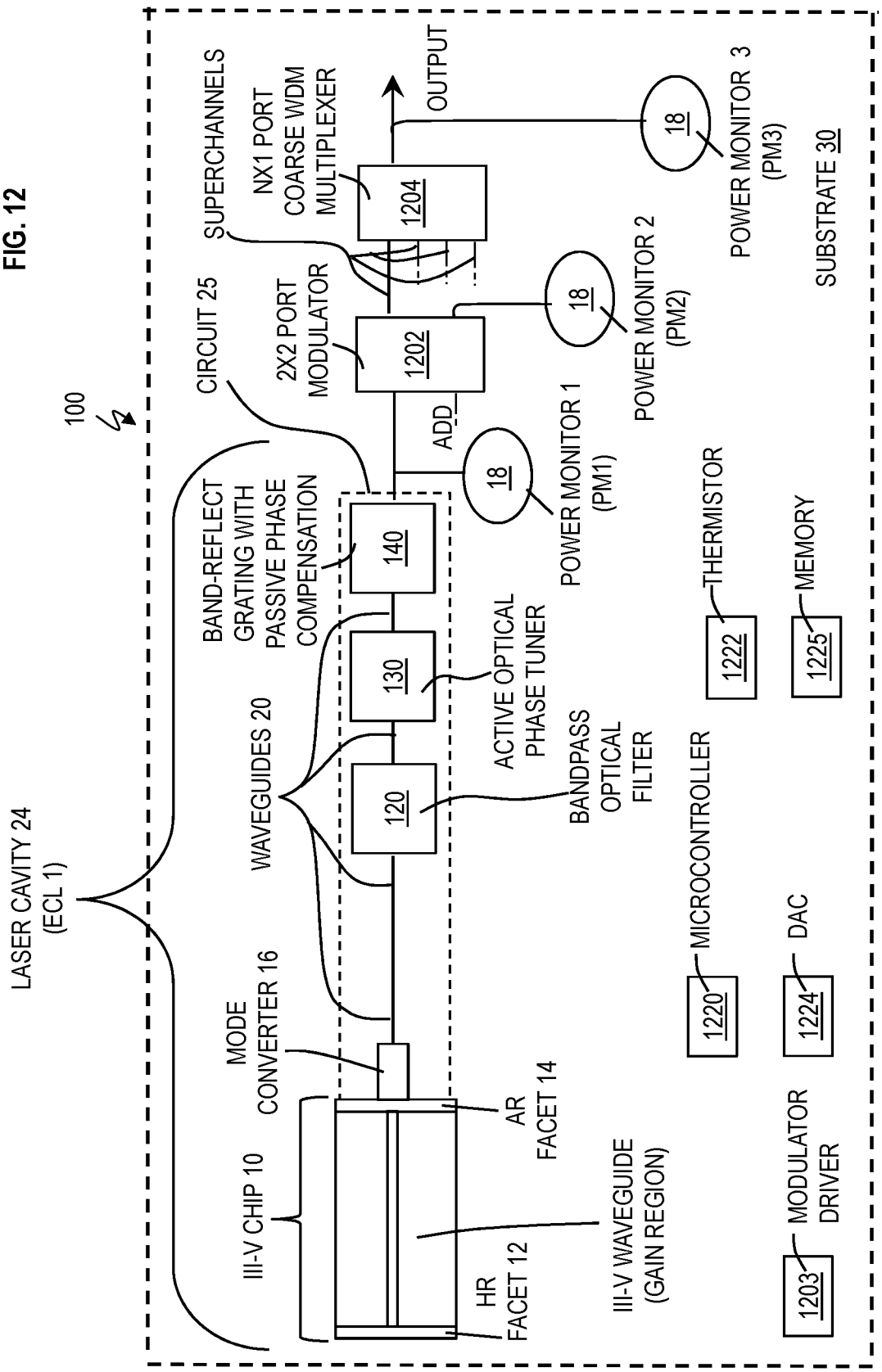
FIG. 12 illustrates a diagram for integrated tunable lasers with a coarse wavelength division multiplexing (CWDM) multiplexer on a semiconductor chip according to an embodiment.

FIG. 12 illustrates integrated tunable lasers for coarse wavelength division multiplexing (CWDM) multiplexer transceivers on silicon, e.g., on the silicon chip 100, according to an embodiment. The silicon chip 100 is a laser or laser system as discussed above. The silicon chip 100 is a laser transmitter (transmitter module), which can connect (i.e., couple) to a laser receiver (receiver module) discussed further herein.

The silicon chip 100 has the III-V chip 10 mounted on the substrate 30, and the III-V chip 10 has the high rear reflective (HR) coating facet 12 on one end and has antireflective (AR) coating facet 14 on the other end. The mode converter 16 couples the III-V chip 10 to the waveguide 20. The waveguide 20 connects to various intra-cavity optical elements in the external integrated photonic circuit 25, which may include the intra-cavity transmission-mode optical band-pass filter 120, the active intra-cavity transmission-mode thermo-optic optical phase tuner element 130, and/or the output coupler band-reflect grating with passive phase compensation 140. The power monitor 18, also referenced as PM1, is connected to the output of the laser cavity 24. The tap for the power monitor (1) 18 may be connected to (and monitors) the output band-reflect grating with passive phase compensation 140.

Additionally, FIG. 12 shows the external integrated photonic circuit 25 coupled to a 2×2 port modulator 1202 via waveguide 20. The 2×2 port modulator 1202 has two input ports (on the left side) and two output ports (on the right side). It is noted that the elements in the laser cavity 24 are also referred to as an external cavity laser (ECL), such as a silicon ECL (Si-ECL). A single ECL (i.e., laser cavity 24) is shown in FIG. 12 for simplicity but discussion applies to multiple ECLs 1-M on the same silicon chip 100 as discussed further in FIG. 19. The top input port of the 2×2 port modulator 1202 is connected to the ECL (laser cavity 24) via the output coupler band-reflect grating with passive phase compensation 140 and the bottom input port is connected to another ECL (laser cavity 24) not shown but discussed further herein. Particularly, the bottom input port is an add port that connects to the top output port of another 2×2 port modulator 1202 (as shown in FIG. 19) connected to another ECL as discussed further herein. High speed data is input to the 2×2 port modulator 1202 as either a voltage or current signal through the modulator driver 1203 that may be either integrated on chip 100 or externally coupled.

The top output port of the 2×2 port modulator 1202 is connected to one input port of the N×1 port coarse WDM multiplexer 1204. The bottom output port of the 2×2 port modulator 1202 is connected to a power monitor 18 (which may be referenced as PM2 to distinguish from other power monitors 18 in the chain). The 2×2 port modulator 1202 helps to prevent attenuation. The 2×2 port modulator 1202 is a device configured to manipulate properties of light beams, such as the optical power or phase. The 2×2 port modulator 1202 increases the intensity of light and may be called an intensity modulator. Once the 2×2 port modulator 1202 modulates the light beams received on the top input port and the bottom input port (add port), the 2×2 port modulator 1202 outputs a superchannel (of light) through its top output port into the top input port of the N×1 port coarse WDM multiplexer 1204. The superchannel is created by the combination of light from ECLs 1-M, e.g., 4 laser cavities 24 shown in FIG. 19. The superchannel is fed to the top input port of the N×1 port coarse WDM multiplexer 1204. Note that each input port of the N×1 port coarse WDM multiplexer 1204 receives a superchannel (also referred to as a super-channel). Although the coarse WDM multiplexer 1204 is shown, it is contemplated that a dense wavelength division multiplexing multiplexer (DWDM) may be utilized. The N×1 port coarse WDM multiplexer 1204 has N input ports on the left side and one output port on the right side. A power monitor 18 (referenced as PM3) taps into the one output port of the N×1 port coarse WDM multiplexer 1204 in order to monitor the output of the N×1 port coarse WDM multiplexer 1204.

A superchannel is an evolution in dense wavelength division multiplexing (DWDM) (or coarse wavelength division multiplexing) in which multiple, coherent optical carriers are combined to create a unified channel of a higher data rate, and the superchannel is brought into service in a single operational cycle. The light output from various ECLs (laser cavities 24) is combined by a concatenation of 2×2 port modulators 1202 (via the add port) in FIG. 19 in order to output a superchannel into a single input port of the N×1 port coarse WDM multiplexer 1204. Rather than a single wavelength line card of greater than (>)100 gigabits per second (Gbit/s) data rates, a superchannel creates a multi-wavelength signal in which each wavelength operates at the maximum data rate permitted by commercially available analog-to-digital converter (ADC) components. The benefits of a superchannel approach are increased spectral efficiency (a consequence of coherent detection) and operational scalability (the ability to bring larger units of long haul optical capacity into service for a given operational effort).

The N×1 port coarse WDM multiplexer 1204 is a device configured to use a multiplexing technique working in the wavelength domain. Wavelength division multiplexing is a technique where optical signals with different wavelengths are combined, transmitted together, and separated again. The N×1 port coarse WDM multiplexer 1204 is configured to set a particular wavelength. The N×1 port coarse WDM multiplexer 1204 is configured to receive a single superchannel (of laser light) at each of its N input ports, combine (multiplex) the superchannels (of laser light), and output the combined superchannels (of light) over the pass band of the N×1 port coarse WDM multiplexer 1204.

A thermistor 1222 is configured to measure the temperature of the substrate 30 on the silicon chip 100. A current output digital-to-analog converter (DAC) 1224 is utilized to power (e.g., provide electrical current) the intra-cavity transmission-mode optical band-pass filter 120, and the DAC 1224 is controlled by a microcontroller 1220. The silicon chip 100 may include a memory array 1225, e.g., such as an e-fuse array. The microcontroller 1220 is connected to (not shown for the sake of conciseness), controls (directly and/or indirectly), and receives feedback from the elements (120, 130, 140, 18 (PM1, PM2, PM3), 1202, 1204, 1222, 1224, 1225, 1226) shown in FIG. 12.

The microcontroller 1220 is configured to perform a self-calibration routine and perform normal operation control as discussed further herein. The microcontroller 1220 includes one or more processing circuits (e.g., processors) configured to process/execute instructions and control the silicon chip 100 as discussed herein. The microcontroller 1220 is shown on the silicon chip 100. In another case, the microcontroller 1220 may be off chip (i.e., not on the silicon chip 100) but connected to the silicon chip 100.

The silicon chip 100 in FIG. 12 is configured for tuning the ECLs (e.g., the laser cavity 24) to transmit light (wavelength) within the pass-band of the N×1 CWDM multiplexer 1204 while accounting for temperature insensitivity and superchannel construction according to an embodiment. The laser light generated and controlled within the pass-band of the N×1 CWDM multiplexer 1204 is at target wavelengths.

The lasing wavelength is set by the intra-cavity transmission-mode optical band-pass filter 120 (e.g., a high-Q band-pass optical filter). The cavity configuration of the laser cavity 24 (ECL) may utilize a thermally tuned ring resonator filter (as the intra-cavity transmission-mode optical band-pass filter 120) to set the lasing wavelength. Filter resonance wavelength (i.e., lasing light wavelength) is a function of temperature and deviates from designed frequency due to fabrication process variation. Embodiments are configured to tune to the allowable target wavelengths in the N×1 port CWDM multiplexer 1204 while self-calibrating out the fabrication process variations in the N×1 port coarse WDM multiplexer 1204. In other words, the laser output of the laser cavity 24 is tuned to be compatible with the N×1 port CWDM multiplexer 1204. Although a CWDM is shown, it is understood that the N×1 port CWDM multiplexer 1204 may be a dense wavelength division multiplexing (DWDM) multiplexer as understood by one skilled in the art.

Figure 13:
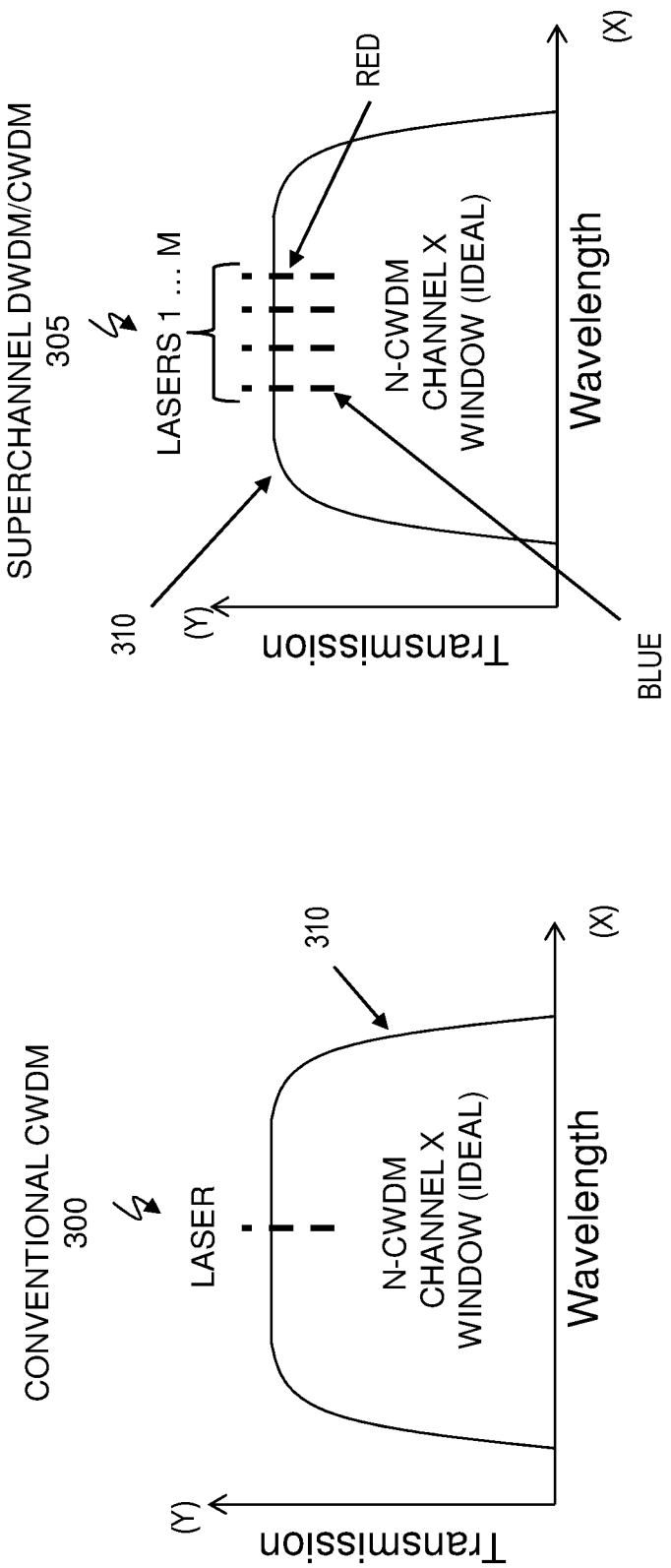
FIG. 13 illustrates graphs of laser wavelength tuning within the pass band of wavelength division multiplexing multiplexers for a single laser and superchannel of multiple lasers according to an embodiment.

FIG. 13 illustrates laser wavelength tuning within integrated WDM transmitters. In FIG. 13, graph 300 shows the pass band of a conventional CWDM and graph 305 shows the pass band of a superchannel DWDM/CWDM.

The graphs 300 and 305 show transmission through the CWDM/DWDM on the y-axis and show wavelength on the x-axis. Each graph 300 and 305 has a pass band waveform 310 shown for the CWDM and/or DWDM, and the pass band shows the group wavelengths with the highest transmission.

In graph 300, a light beam of a single laser may have a wavelength that corresponds to the peak of the pass band waveform 310, which means that that the light passes through the CWDM and is not blocked. In graph 300, the wavelength of the single laser has large window in which the wavelength may move left (decrease) or right (increase) along the x-axis and still remain in the pass band of the CWDM.

However, a superchannel does not have a single wavelength of light but has many wavelengths of light each corresponding to different lasers (i.e., multiple ECLs on silicon chip 100). In graph 305, the different wavelengths each have to pass through the pass band of the pass band waveform 310 without being blocked. In graph 305, the group of wavelengths of the different lasers (ECLs 1-M) has very little room to shift left or right in wavelength along the x-axis before some wavelengths are blocked. In other words, the lasing wavelength must be controlled/tuned during operation to be within the pass band of the CWDM multiplexer transmission function for each channel by thermal tuning of the intra-cavity filter resonance according to embodiments. The broad pass band of the CWDM grid allows for multiple DWDM bands assuming proper control of laser wavelengths to enable N×M superchannel transmitters according to embodiments. As will be seen in FIGS. 17A and 17B, each ECLs 1-M generates and has to tune to its own target wavelength $\lambda_{target}$1-M within the pass band of the N×1 CWDM multiplexer 1204.

Since inputting superchannels (containing multiple wavelengths) to the N×1 port CWDM multiplexer 1204 requires that all of the wavelengths of light be within the pass band of the N×1 port CWDM multiplexer 1204 (i.e., at the peak of transmission in the waveform 310), the silicon chip 100 in FIG. 12 is configured to tune the wavelength of each laser cavity 24, which is an ECL, to be within the pass band of the N×1 port CWDM multiplexer 1204 while taking into account temperature changes (as discussed above) and fabrication variations in the N×1 port CWDM multiplexer 1204 (as discussed below).

Figure 14A:
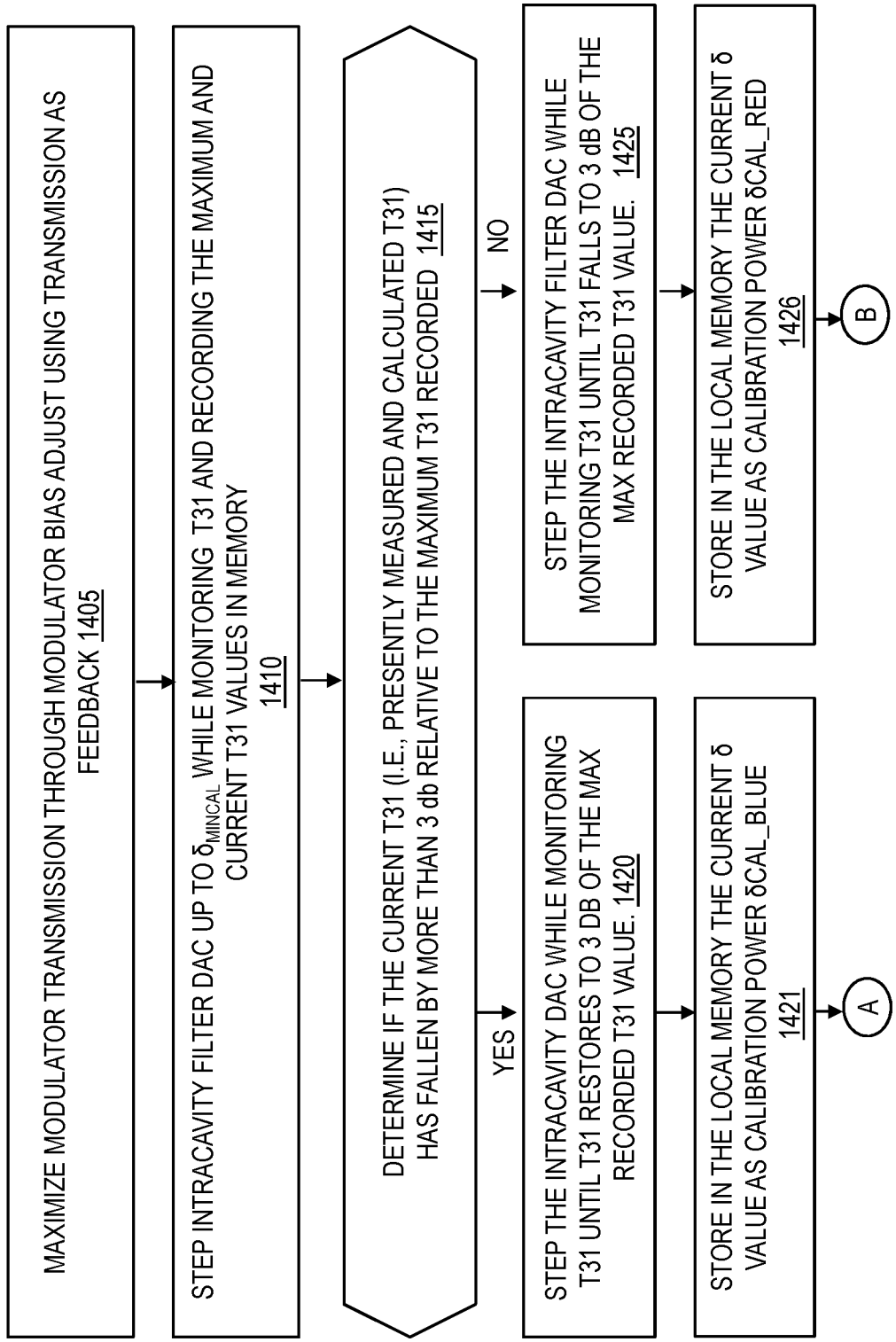

Accordingly, FIG. 12 (and FIG. 19) is configured to perform and/or incorporate the following, via microcontroller 1220:

(1) Utilize manufacturing consistency of thermal impedance and ambient temperature uniformity to enable open-loop control of the laser wavelength based on a 1-time programmed on-chip e-fuse array (such as the memory array 1225) and based on self-testable parameters in a verification test (i.e., self-calibration routine/test discussed in FIGS. 14A and 14B). The verification test may be performed on wafer-scale.

(2) On chip test parameter is the transmission of the laser (ECL/laser cavity 24) through the CWDM channel pass band for the transmitter.

(3) 3 on-chip power monitors 18 (PM1, PM2, PM3) are required for the self-calibration routine (self-test) and are also useful for transceiver operation monitoring for link health.

(4) DAC drive codes (of the current output digital-to-analog converter (DAC) 1224) for the intra-cavity filters are calculated from initialized parameters and the ambient temperature as measured by the on-chip monitor thermistor 1222 or bandgap reference. The microcontroller 1220 controls power to the intra-cavity transmission-mode optical band-pass filter 120, active intra-cavity transmission-mode thermo-optic optical phase tuner element 130, and/or the output coupler band-reflect grating with passive phase compensation 140 via one or more DACs 1224.

(5) CWDM passband temperature dependence and fabrication uncertainty are determined in order to determine minimum guard bands (such as, e.g., guard bands 1655, 1660 in FIGS. 16A, 16B and in FIGS. 17A, 17B) for transceiver/receiver operation. Note that the silicon chip 100 in FIG. 12 (and FIG. 19) is a transmitter and/or transceiver.

Table 1 provides definitions that can be utilized to discuss the initial e-fuse self-calibration routine in FIGS. 14A and 14B (also referred to as a self-test, verification, calibration, etc.) and the normal operation control (in FIG. 15) of the laser on the silicon chip 100. Table 1 is provided below.

TABLE 1

Definitions $T_{amb}$ - Local ambient temperature as measured by on-chip thermistor/other integrated temperature sensor. (Kelvin (K) units)
$T_{transmaxop}$ - Transceiver maximum designed operating temperature referenced to the position of the $T_{amb}$ sensor (K units)
$T_{cal}$ - The ambient temperature measured during the self-calibration routine (K units)
$\Delta T_{calbuffer}$ - Excess required during calibration such that the operating filter temperature will always be above ambient (K units)
$\lambda^0_{filter}$ - Wavelength of the initial in-band intra-cavity filter order (nanometer (nm) units)
$\lambda^{-1}_{filter}$ - Wavelength of the next higher order filter mode (nm units)
$\lambda_{target}$ - Target laser operation wavelength (nm units)
$\sigma$ - Standard deviation of CWDM wavelength variation that results from fabrication uncertainty (nm units).
$\lambda_{red}$ - Wavelength of the red CWDM passband edge at the calibration temperature + $3\sigma$ fabrication uncertainty (nm units) $\lambda_{blue}$ - Wavelength of the blue CWDM passband edge at the calibration temperature - $3\sigma$ fabrication uncertainty (nm units)
$\kappa$ - Known thermal impedance of the intra-cavity filter relative to the local ambient temperature $T_{amb}$ in (K/watts (W) units - may be implemented in terms of unitless DAC codes)
$\delta$ - Intra-cavity filter heater control DAC code converted to power (W units - may be implemented in terms of unitless DAC codes)
$\delta_{max}$ - Maximum power DAC is capable of outputting for the intra-cavity filter (W units - may be implemented in terms of unitless DAC codes)
$\delta_{mincal}$ - Minimum filter calibration DAC power = $(T_{transmaxop} + \Delta T_{calbuffer} - T_{amb})/\kappa$ (W units - may be implemented in terms of unitless DAC codes)
$\delta_{cal\_red}$ - DAC power for 3-dB CWDM passband transmission calibration point on the red edge (W units - may be implemented in terms of unitless DAC codes)
$\delta_{cal\_blue}$ - DAC power for 3-dB CWDM passband transmission calibration point on the blue edge (W units - may be implemented in terms of unitless DAC codes)
$d\lambda/d\delta$ - Change in filter wavelength as a function of the change in DAC power (nm/W units)
$\delta_{offset}$ - DAC power offset from the nominal calibration value to allow offsets of multiple lasers to a single calibration point or channel centering to minimize loss (W units - may be implemented in terms of unitless DAC codes)
RB - Single bit to define whether the control loop should operate relative to the red (utilizing $\delta_{cal\_red}$) or blue (utilizing $\delta_{cal\_blue}$) CWDM edge (unitless)

TABLE 1-continued

Definitions

PM1 - Power measured by power monitor 1 tap of laser output waveguide (W units)
PM2 - Power measured by power monitor 2 at unused modulator port output (W units)
PM3 - Power measured by power monitor 3 tap of multiplexed CWDM output waveguide (W units)
TR1 - Tap power ratio for power monitor 1 (unitless). The tap power ratio (also referred to as the split power ratio) is the amount of light that is directed from the optical network to the power monitor 1. TR1 is predefined in advance.
TR3 - Tap power ratio for power monitor 3 (unitless). The tap power ratio (also referred to as the split power ratio) is the amount of light that is directed from the optical network to the power monitor 3. TR3 is predefined in advance.
T21 - Transmission through the modulator (1202) as measured by ((PM1*TR1 − PM2)/(PM1*TR1))
T31 - Transmission through the CWDM channel passband (1204) as measured by (PM3*TR3)/(PM1*TR1)

FIGS. 14A and 14B illustrate a block diagram of the self-calibration routine 1400 according to an embodiment. The microcontroller 1220 is configured to execute and/or initiate the self-calibration routine 1400 on the silicon chip 100, and receives feedback from the elements in FIG. 12. The microcontroller 1220 stores all calculated and measured values in the memory 1225. The self-calibration routine 1400 also applies to each individual laser cavity 24 in FIG. 19.

At block 1405, the microcontroller 1220 is configured to maximize modulator transmission (driven with DC '1' signal or any predefined, constant drive signal by the modulator driver 1203) through modulator bias adjust (of the 2×2 port modulator 1202), by using transmission feedback (T21) through the 2×2 port modulator 1202 as measured by the power monitor (PM2) 18. The microcontroller 1220 is configured to apply a modulator bias (e.g., voltage) via a modulator bias controller (MBC) in order to maintain a maximum transmission throughput in the 2×2 port modulator 1202. The maximum transmission throughput in the 2×2 port modulator 1202 allows the maximum amount of laser light to pass through. In the case when the 2×2 port modulator 1202 is narrowband, the microcontroller 1220 is configured to maintain T21 using/receiving modulator bias feedback through power monitor (PM2) 18 (as understood by one skilled in the art) throughout the subsequent calibration steps.

At block 1410, the microcontroller 1220 is configured to step intra-cavity filter (current output) DAC 1224 up to the minimum filter DAC power ($\delta_{mincal}$) while monitoring transmission (T31) through the CWDM channel pass band (of the of the N×1 port CWDM multiplexer 1204) as measured by the power monitor 3 (PM3) 18, all while the microcontroller 1220 records the maximum transmission T31 value and current transmission T31 value in memory 1225. For example, the microcontroller 1220 causes the current output DAC 1224 to continuously increase electrical current (via DAC 1224) to the heater of the intra-cavity transmission-mode optical band-pass filter 120 until the current output of the DAC 1224 reaches $\delta_{mincal}$ (which may be the initial minimum calibration power set in advance). Increasing the electrical current to the intra-cavity transmission-mode optical band-pass filter 120 causes the wavelength (i.e., mode) to correspondingly increase in the laser cavity 24. As the wavelength changes (e.g., along the x-axis in FIGS. 16 and 17) for the laser light, the microcontroller 1220 stores the transmission throughput T31 (e.g., the transmission response on the y-axis) of the N×1 port CWDM multiplexer 1204 at the different wavelengths.

At block 1415, the microcontroller 1220 is configured to determine/check if the current transmission T31 (i.e., presently measured and calculated T31) has fallen by more than 3 db relative to the maximum transmission T31 recorded. Assuming the tap power ratio TR1 and the tap power ratio TR3 both remain constant, the value of the transmission through the CWDM multiplexer 1204 channel pass band is based on (or changes according to) the measurements of PM3/PM1. The maximum transmission T31 has been stored in memory 1225, along with each value of transmission T31 passing through N×1 port CWDM multiplexer 1204.

At block 1420, when the current transmission T31 has fallen down by more than 3 dB compared to the maximum recorded transmission T31, the microcontroller 1220 is configured to step up the intra-cavity current DAC 1224 (i.e., increase the current output from the DAC 1224 to the intra-cavity transmission-mode optical band-pass filter 120) while monitoring T31 until T31 restores to (at least and/or within) 3 dB of the maximum recorded T31 value. Stepping up the electrical current to the intra-cavity transmission-mode optical band-pass filter 120 serves to switch the operating laser mode (wavelength) from $\lambda^0_{filter}$ to $\lambda^{-1}_{filter}$ and shift the laser operating condition from the red side to the blue side of the CWDM pass band of N×1 port CWDM multiplexer 1204. That is, the wavelength (i.e., laser operating mode) is stepped up (increase power from DAC 1224) in order to calibrate to blue side in FIGS. 13, 16, 17.

At block 1421, the current DAC 1224 code (the present δ determined in block 1420) is stored in local memory 1225 as the calibration power $\delta_{cal\_blue}$.

At block 1422, the microcontroller 1220 is configured to step up the intra-cavity current DAC 1224 (i.e., increase the current output from the DAC 1224 to the intra-cavity transmission-mode optical band-pass filter 120) while monitoring T31 until T31 falls to (at least) 3 dB of the maximum recorded T31 value.

At block 1423, the current DAC 1224 code (the present δ determined in block 1422) is stored in local memory 1225 as the calibration power $\delta_{cal\_red}$.

In the alternative case of 1415, at block 1425, when the current transmission T31 (presently monitored/calculated) has not fallen by more than 3 dB compared to the maximum recorded transmission T31 over the sweep up to $\delta_{min}$, the microcontroller 1220 is configured to step the intra-cavity filter current DAC 1224 (i.e., increase the current output from the DAC 1224 to the intra-cavity transmission-mode optical band-pass filter 120) while monitoring T31 until transmission T31 falls to 3 dB of the maximum recorded transmission T31 value. Now, the laser is operating on the red side of the CWDM passband.

At block 1426, the current DAC 1224 code (the present δ determined in block 1425) is stored in local memory 1225 as the calibration power $\delta_{cal\_red}$.

At block 1427, the microcontroller 1220 is configured to step up the intra-cavity current DAC 1224 (i.e., increase the current output from the DAC 1224 to the intra-cavity transmission-mode optical band-pass filter 120) while monitoring T31 until T31 restores to (within) 3 dB of the maximum recorded T31 value.

At block 1428, the current DAC 1224 code (the present δ determined in block 1427) is stored in local memory 1225 as the calibration power $\delta_{cal\_blue}$.

At block 1430, the microcontroller 1220 is configured to store in the memory 1225 (e.g., e-fuse array) the following parameters:

1) store $T_{amb}$ as the calibration temperature $T_{cal}$;

2) store the local memory value $\delta_{cal\_blue}$ as calibration power $\delta_{cal\_blue}$; and 3) store the local memory value $\delta_{cal\_red}$ as calibration power $\delta_{cal\_red}$.

FIG. 15 illustrates a block diagram 1500 of the normal operation control of the silicon chip 100 after the self-calibration routine 1400 according to an embodiment. The microcontroller 1220 is configured to execute the normal operation control on the silicon chip 100. Again, the microcontroller 1220 stores all calculated and measured values in the memory 1225.

At block 1505, the microcontroller 1220 is configured to determine the DAC 1224 output power (e.g., required electrical current) from calibration parameters and known system parameters, where the self-calibration routine in FIGS. 14A and 14B enable feedback-free laser wavelength control to speed system initialization and eliminate dither/loop instability. That is, once the self-calibration routine 1400 has been executed for each ECL (laser) and feedback is received by the microcontroller 1220, the self-calibrated ECLs 1-M are able to run with feedback-free laser wavelength control. The DAC 1224 output power is the electrical current that needs to be applied to the intra-cavity transmission-mode optical band-pass filter 120 to maintain the target wavelength within the pass band of the N×1 port CWDM multiplexer 1204 while taking into account fabrication variation of the to the N×1 port CWDM multiplexer 1204 (as determined during the self-calibration routine 1400).

At block 1510, the microcontroller 1220 is configured to read the bit (RB) in the memory 1225 to determine whether the bit (RB) has been set to the red edge or blue edge in FIGS. 14A and 14B.

At block 1515, when the bit (RB) is set to the red edge, the microcontroller 1220 is configured to perform red edge calibration (where the red edge is defined for the highest end of uncertainty): $\delta=\delta_{cal\_red}-\delta_{offset}-((\lambda_{red}-\lambda_{target})/d\lambda/d\delta)-((T_{amb}-T_{cal})/\kappa)$. Accordingly, the target wavelengths generated by the ECLs are to be set at and/or below the red edge defined for the highest end of uncertainty (in FIGS. 16 and 17).

At block 1520, when the bit (RB) is set to the blue edge, the microcontroller 1220 is configured to perform blue edge calibration (where the edge is defined for the lowest end of uncertainty): $\delta=\delta_{cal\_blue}+\delta_{offset}+((\lambda_{target}-\lambda_{blue})/d\lambda/d\delta)-((T_{amb}-T_{cal})/\kappa K)$. Accordingly, the target wavelengths generated by the ECLs are to be set below and/or above the red edge defined for the lowest end of uncertainty (in FIGS. 16 and 17).

In the above calculation of DAC 1224, output power is offset by the preset value of $\delta_{offset}$ by the microcontroller 1220. This may be defined by the system designer to implement options such as targeting the operation wavelength to be close to center of the CWDM band for optimal transmission and/or as close as possible to the blue edge to minimize tuning power. This can be coupled with the RB bit to automatically minimize tuning power by using logic on the microcontroller 1220 to pick the minimum required DAC 1224 output power. Alternatively, in the super-channel case in which multiple ECL channels are tuned within a single CWDM band, optimal tuning precision can be achieved by uniformly setting the RB bit for all channels and utilizing different $\delta_{offset}$ values to space the operating wavelengths appropriately through the CWDM band.

The cavity round-trip phase is actively controlled through power feedback by maximizing PM1 (power monitor (1) 18) throughout operation. When the cavity round-trip phase changes, the power/current applied to the active intra-cavity transmission-mode thermo-optic optical phase tuner element 130 increases or decreases in order to maintain the round-trip phase. Maintaining the round-trip phase maintains the laser wavelength in the laser cavity 24 (ECL). Any deviation caused by improper round-trip phase results in reduced output power by the Fabry-Perot round trip longitudinal mode frequencies deviating from the peak of the intracavity filter transmission function. Therefore adjusting the phase tuner element 130 maximizes output power while maintaining operation wavelength. Any feedback algorithm suitable for maximization applications can be implemented on the microcontroller as is known by those skilled in the art. It is noted that the active intra-cavity transmission-mode thermo-optic optical phase tuner element 130 is connected to the power monitor 18 (PM1) (via band-reflect grating with passive phase compensation 140) in order to provide feedback to the microcontroller 1220 (thus maintaining the round-trip phase).

Turning to FIG. 16A, graph 1605 illustrates the allowable target wavelength range 1650 at which to make/insert the target wavelength ($\lambda_{target}$) of the ECL in order to pass through the pass band of the N×1 port CWDM multiplexer 1204, while taking into fabrication variations in the N×1 port CWDM multiplexer 1204. FIG. 16B illustrates graph 1610 that shows the allowable target wavelength range at which to make/insert the target wavelength ($\lambda_{target}$) in order to pass through the pass band of an N×1 port CWDM demultiplexer in a receiver (e.g., the N×1 port CWDM demultiplexers 2104 in a superchannel DWDM/CWDM receiver 2100 in FIG. 21), while taking into fabrication variations in the N×1 port CWDM demultiplexer 2104. Note that the N×1 port CWDM multiplexer 1204 in the silicon chip 100 (which is the transmitter module) has the same fabrication variations as the N×1 port CWDM demultiplexer 2104 in a silicon chip 2100 (which is the receiving module). The target wavelength can be defined to the microcontroller 1220 by the system designer through the $\delta_{offset}$ parameter.

Based on fabrication uncertainty (in the N×1 port CWDM multiplexer 1204 and the N×1 port CWDM demultiplexer 2104) and temperature changes, the pass band shifts. The minimum operating temperature is from the left (on the x-axis for wavelength) and the maximum operating temperature is to the right (on the x-axis for wavelength). According to manufacturing/fabrication uncertainty (i.e., manufacturing tolerances), this examples illustrates that there are six possible pass band waveforms 1611, 1612, 1613, 1614, 1615, 1616 (shifting from left to right in wavelength) shown in both FIGS. 16A and 16B. The target wavelength ($\lambda_{target}$) is to fall within the allowable target wavelength range 1650, which is within the pass band of all the waveforms 1611, 1612, 1613, 1614, 1615, 1616. This means that the laser in the laser cavity 24 (ECL) is controlled to have a target wavelength within the target wavelength range 1650, and the manufacturing tolerances (i.e., fabrication uncertainty) is known in advance. The target wavelength in FIGS. 16A and 16B ensures that the laser light generated by the laser cavity 24 (ECL) on the silicon chip 100 is able to pass through the both N×1 port CWDM multiplexer 1204 and the N×1 port CWDM demultiplexer 2104 even though pass band waveforms may shift from the waveform 1611 at the far left to the waveform 1616 at the far right. The self-calibration routine 1400 executed by the microcontroller 1220 ensures that the calibrated laser cavity 24 (ECL) stays within the target wavelength range 1650.

The edge transmission pass bands 1655 and 1660 may each be set to be a −1 db pass band range. This means that the edge transmission pass band 1655 is a 1 db pass band range below the blue edge of the target wavelength range 1650, while the edge transmission pass band 1660 is a 1 db pass band range above the red edge of the target wavelength range 1650. In another case, the edge transmission pass bands 1655 and 1660 may each be set to −3 db pass band range of the target wavelength range 1650. Although the target wavelength $\lambda_{target}$ can operate in the edge transmission pass bands 1655 and 1660, there may be high insertion loss in these areas. The target wavelength range/band 1650 sets the allowable wavelengths in the worst case corners with self-calibration uncertainty. The blue edge/side of the target wavelength range/band 1650 has the lowest energy consumption (by the active intra-cavity transmission-mode thermo-optic optical phase tuner element 130 to control phase/wavelength of the laser light) while the red edge/side of the target wavelength range/band 1650 requires the highest energy consumption.

The self-calibration routine 1400 executed by the microcontroller 1220 of the silicon chip 100 determines the target wavelength range/band 1650 in which the target wavelength is to be inserted. The self-calibration routine 1400 and the normal operation control 1500 include the thermal impedance κ and thermo-optic coefficients dλ/dδ of the intra-cavity transmission-mode optical band-pass filter 120 as the (required) parameters for the control loop. If these parameters (the thermal impedance κ and thermo-optic coefficients dλ/dδ) are not stable enough for the desired wavelength accuracy, the parameters can be measured on a lot or wafer level and then programmed into the die through the e-fuse array during the self-calibration routine as well. If narrow-band modulators are utilized for 2×2 port modulator 1202, the free-spectral range of the resonant 2×2 port modulator 1202 and the intra-cavity transmission-mode optical band-pass filter 120 are to be matched.

The free spectral range of the intra-cavity transmission-mode optical band-pass filter 120 is to be larger than the CWDM pass band full-width at half maximum (FWHM) of the N×1 port CWDM multiplexer 1204.

The laser operating range, e.g., reflection bandwidth of the output coupler band-reflect grating with passive phase compensation 140, should be larger than the CWDM pass band FWHM (of the N×1 port CWDM multiplexer 1204) while accounting for the fabrication uncertainties of both components.

Figure 18A:
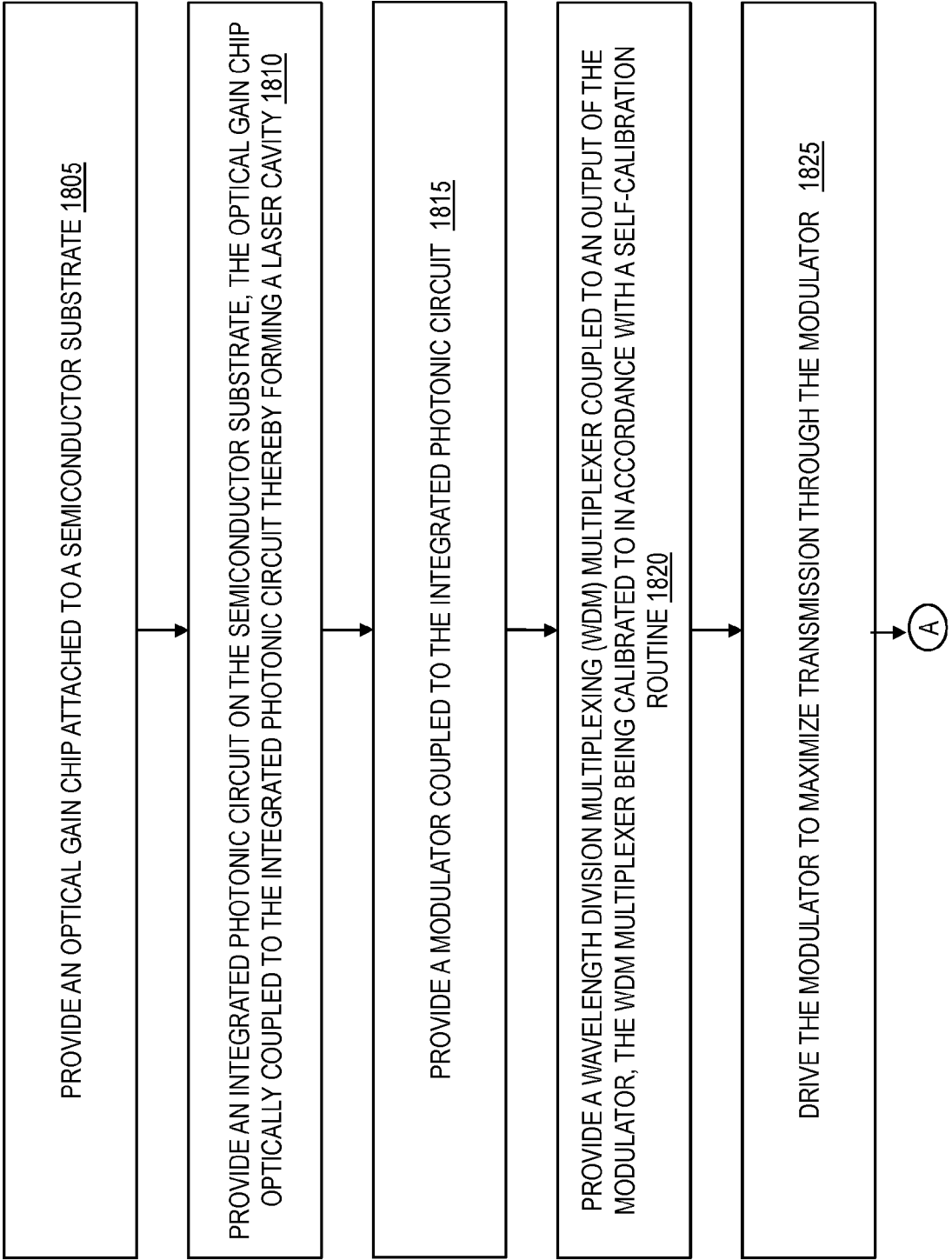
FIGS. 18A and 18B together illustrate a method for configuring a semiconductor chip to have a self-calibrated laser according to an embodiment.
Figure 18B:
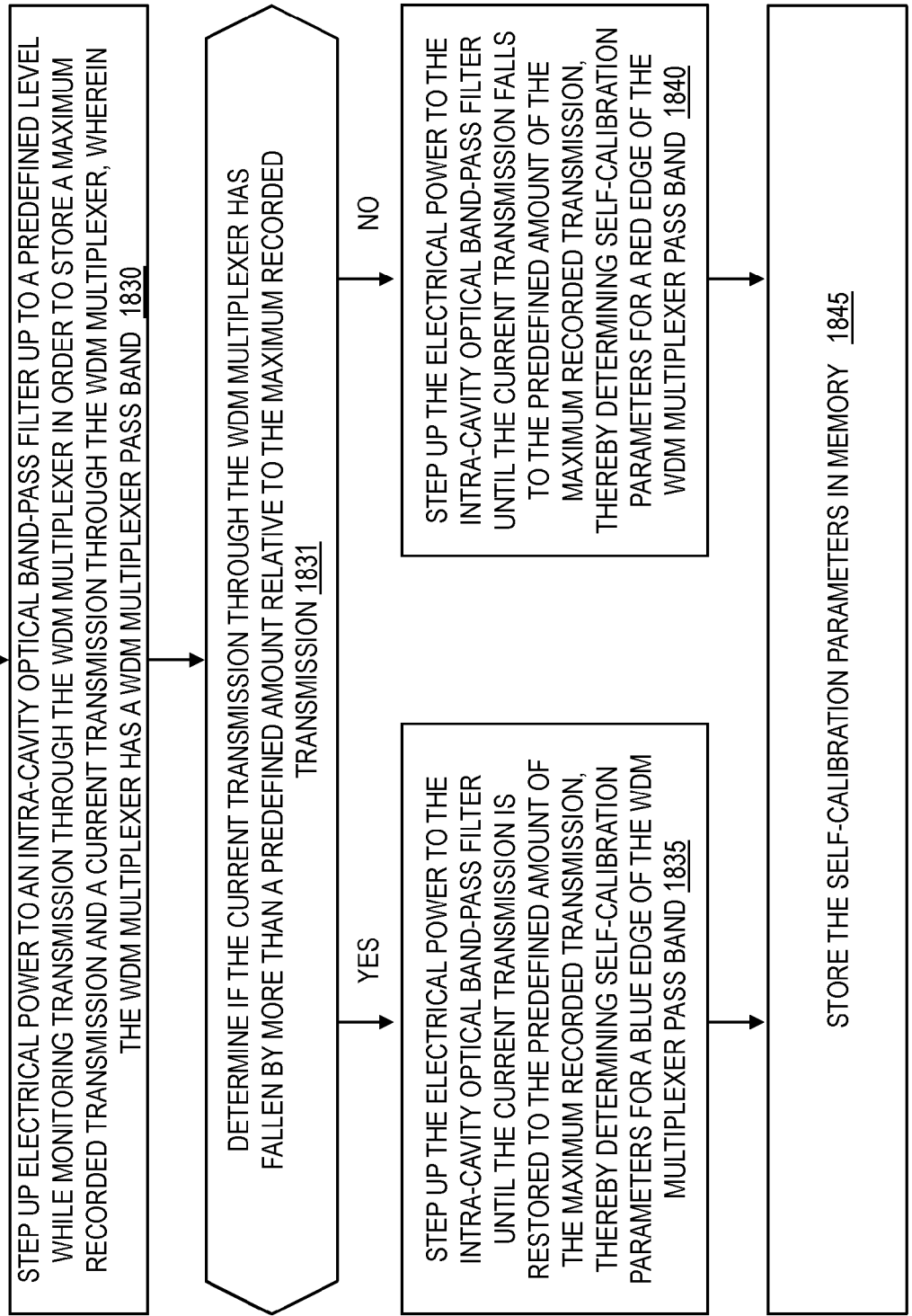

Now turning to FIGS. 18A and 18B, a method 1800 is provided for configuring a semiconductor chip 100 having the ECL (laser) that is self-calibrated via the self-calibration routine 1400 according to an embodiment.

At block 1805, the optical gain chip 10 attached to the semiconductor substrate 30 is provided. At block 1810, the integrated photonic circuit 25 on the semiconductor substrate 30 is provided, such that the optical gain chip 10 is optically coupled to the integrated photonic circuit thereby forming a laser cavity 24.

At block 1815, the modulator 1202 is coupled to the integrated photonic circuit 25. At block 1820, the wavelength division multiplexing (WDM) multiplexer 1204 is coupled to an output of the modulator 1202, and the WDM multiplexer 1204 is calibrated to in accordance with a self-calibration routine.

The self-calibration routine is configured to be executed by the microcontroller 1220. At block 1825, the microcontroller 1220 is configured to drive the modulator 1202 (by applying a modulator bias voltage) to maximize transmission through the modulator 1202. At block 1830, the microcontroller 1220 is configured to step up electrical power (via of DAC 1224) to the intra-cavity optical band-pass filter 120 up to a predefined level while continuously monitoring light transmission (via power monitor 18 (PM3)) through the WDM multiplexer 1204 in order to store a maximum recorded transmission (measured earlier) and a current transmission (presently measured and occurring) through the WDM multiplexer 1204, where the WDM multiplexer has a WDM multiplexer pass band. At block 1831, the microcontroller 1220 is configured to check the current transmission (presently measured) through the WDM multiplexer 1204 relative to the maximum recorded transmission and determine whether or not the transmission has fallen by more than a predefined amount (e.g., 3 dB).

At block 1835, the microcontroller 1220 is configured to, when the outcome of block 1831 is positive, step up the electrical power (via of DAC 1224) to the intra-cavity optical band-pass filter 120 until the current transmission (being presently measured) is restored (rises) to the predefined amount of the maximum recorded transmission (e.g., 3 db of the maximum recorded transmission), thereby determining self-calibration parameters for a blue edge of the WDM multiplexer pass band. The blue edge is shown in FIGS. 16A, 16B, 17A, 17B.

At block 1840, the microcontroller 1220 is configured to, when the outcome of block 1831 is negative, step up the electrical power (via DAC 1224) to the intra-cavity optical band-pass filter 120 until the current transmission falls (reduces) to the predefined amount of the maximum recorded transmission (e.g., falls to the 3 db of the maximum recorded transmission), thereby the self-calibration parameters for a red edge of the WDM multiplexer pass band. The red edge is shown in FIGS. 16A, 16B, 17A, 17B.

At block 1845, the microcontroller 1220 stores the self-calibration parameters in memory 1225 as determined and/or measured from the self-calibration routine 1400.

The self-calibration parameters include a bit (e.g., RB bit stored in memory 1225) defining whether the self-calibration routine is calibrated to the blue edge and/or the red edge of the WDM multiplexer pass band of the WDM multiplexer 1204.

Further, the self-calibration parameters (stored in memory 1225) include: setting an ambient temperature as a calibration temperature, and setting the electrical power measured, at the predefined amount (e.g., 3 db) of the maximum recorded transmission corresponding to the blue edge or red edge of the WDM multiplexer pass band, as a calibrated electrical power. The self-calibration parameters (stored in memory 1225) are utilized to calibrate from the blue edge and/or the red edge of the WDM multiplexer pass band.

When calibrating from red edge of the WDM multiplexer pass band (in FIGS. 16A, 16B, 17A, 17B), the microcontroller 1220 is configured to decrease the calibrated electrical power corresponding to the red edge of the WDM multiplexer pass band in order to determine a normal operation electrical power for operating at a target wavelength $\lambda_{target}$. For example, the DAC 1224 can decrease electrical power to the intra-cavity optical band-pass filter 120 to drop to a target wavelength below the red edge of the WDM multiplexer pass band (but above the blue edge), as directed by the microcontroller 1220.

When calibrating from blue edge of the WDM multiplexer pass band (in FIGS. 16A, 16B, 17A, 17B), the microcontroller 1220 is configured to increase the calibrated electrical power corresponding to the blue edge of the WDM multiplexer pass band in order to determine a normal operation electrical power for operating at a target wavelength. For example, the DAC 1224 can increase electrical power to the intra-cavity optical band-pass filter 120 to increase to a target wavelength above the blue edge of the WDM multiplexer pass band (but below the red edge), as directed by the microcontroller 1220.

The blue edge of the WDM multiplexer pass band corresponds to a lower edge (lower wavelength) of the WDM multiplexer pass band through which light transmission can occur. The red edge of the WDM multiplexer pass band corresponds to a higher edge (higher wavelength) of the WDM multiplexer pass band through which light transmission can occur.

The integrated photonic circuit 25 comprises the active intra-cavity thermo-optic optical phase tuner element 130, the intra-cavity optical band-pass filter 120, and the output coupler band-reflect optical grating filter with passive phase compensation 140 which are all optically coupled together.

FIGS. 17A and 17B correspond to the description of FIGS. 16A and 16B except that FIGS. 17A and 17B show multiple target wavelengths $\lambda_{target}$ 1-M, which is one target wavelength for each ECL 1-M (each laser cavity 24) in FIG. 19. In FIG. 17A, the graph 1605 illustrates the allowable target wavelength range 1650 at which to make/insert the multiple target wavelengths $\lambda_{target}$ 1-N in order to pass through the pass band of the N×1 port CWDM multiplexer 1204, while taking into fabrication variations in the N×1 port CWDM multiplexer 1204. FIG. 17B illustrates the graph 1610 that shows the allowable target wavelength range 1650 at which to make/insert the target wavelength ($\lambda_{target}$) in order to pass through the pass band of the N×1 port CWDM demultiplexer 2104 (e.g., receiver module) in FIG. 21, while taking into fabrication variations in the N×1 port CWDM demultiplexer 2104. The process of further creating multiple target wavelengths $\lambda_{target}$ 1-N is discussed below in FIG. 19.

Accordingly, the same principle discussed above in FIGS. 12-18 can be applied to multiple Si-ECLS ((multiple laser cavities 24) on the same silicon chip 100) per CWDM pass band in superchannel creation. Now, discussion turns to Si-ECL tuning for superchannel creation within CWDM pass bands. When the multiple laser cavities 24 (multiple ECLs) are utilized to create superchannels (as shown in FIG. 19), the initialization algorithms, tuning algorithms, and requirements executed by the microcontroller 1220 (i.e., self-calibration routine and normal operation in FIGS. 14 and 15, respectively) match the single-channel case (typical CWDM) with some extra clarifications regarding the more complex application.

The benefit of the previously described self-calibration routine 1400 is that although the CWDM pass band uncertainty may or may not be removed (completely) in the N×1 port CWDM multiplexer 1204, the fabrication uncertainty of the intra-cavity transmission-mode optical band-pass filter 120 is calibrated out (i.e., removed). The calibration procedure has effectively determined all required control parameters to set the relative frequency alignment of the filter resonance with regard to the CWDM transmission band.

Instead of controlling for a single target wavelength (such as $\lambda_{target}$ in FIGS. 16A and 16B) within the allowable range (particularly target wavelength range/band 1650) of the CWDM band in N×1 port CWDM multiplexer 1204, multiple target wavelengths (such as such as $\lambda_{target}$ 1-M in FIGS. 17A and 17B) can be chosen for each CWDM band at an arbitrary spacing. The wavelength spacing between each one of the target wavelengths $\lambda_{target}$ 1-M (e.g., target wavelength 1, target wavelength 2, target wavelength 3, target wavelength 4) can be 2 nm. This spacing is established in the control algorithm by setting different $\delta_{offset}$ parameters for each $\delta_{target}$.

The multiple Si-ECL transmitters (such as ECLs 1-M) can be combined through the add port of the narrowband modulators 1202 in the transmitter schematic shown FIG. 19, using a concatenation configuration.

FIG. 19 illustrates a superchannel DWDM/ coarse WDM laser transmitter using Si-ECLs 1-M on a silicon chip, such as the silicon chip 100, according to an embodiment. FIG. 19 includes the features of FIG. 12, except that FIG. 19 shows multiple (laser cavities 24) ECLs 1-M on the same silicon chip 100, where each output of each ECL 2-M is consecutively added to the add port of the next 2×2 port modulator 1202 (eventually combining with ECL 1) to generate a superchannel that is input eventually into the N×1 port CWDM multiplexer 1204. The silicon chip 100 is a laser or laser system as discussed above. The silicon chip 100 operates as a superchannel DWDM/CWDM transmitter (transmitter module), which can connect (i.e., optically couple) to the receiver 2100 in FIG. 21 (receiver module) discussed further herein.

As noted above, the silicon chip 100 has the III-V chip 10 mounted on the substrate 30, and the III-V chip 10 has the high rear reflective (HR) coating facet 12 on one end and has antireflective (AR) coating facet 14 on the other end. The mode converter 16 couples the III-V chip 10 to the waveguide 20. Additionally, the waveguide 20 connects the intra-cavity transmission-mode optical band-pass filter 120, the active intra-cavity transmission-mode thermo-optic optical phase tuner element 130, and/or the output coupler band-reflect grating with passive phase compensation 140.

FIG. 19 shows the external integrated photonic circuit 25 coupled to the 2×2 port modulator 1202 via waveguide 20. The 2×2 port modulator 1202 has two input ports (on the left side) and two output ports (on the right side). Each one of the multiple ECLs 1-M on the same silicon chip 100 has its own 2×2 port modulator 1202, where the top input port of the 2×2 port modulator 1202 is connected to the respective ECL 1-M (laser cavity 24) via the output coupler band-reflect grating with passive phase compensation 140, while the bottom add input port is connected to another previous ECL. Note that the bottom add input port of ECL M is unused. The bottom input port is the add port that connects to the top output port of the previous output of the 2×2 port modulator 1202 in the cascading configuration as shown in FIG. 19. This cascading configuration continues through the 2×2 port modulator 1202 in ECL 1, and the 2×2 port modulator 1202 of ECL 1 outputs the combined/modulated light of ECL 1-M into the N×1 port CWDM multiplexer 1204.

Once the last 2×2 port modulator 1202 (of ECL 1) modulates the continuous wave (CW) light beam received on the top input port and passes through the modulated light beams received at the bottom input port (add port), the last 2×2 port modulator 1202 outputs a superchannel (of light) through its top output port into the top input port of the N×1 port coarse WDM multiplexer 1204. The superchannel is created by the combination of light from ECLs 1-M (which are, e.g., the 4 laser cavities 24 shown in FIG. 19). The superchannel is fed to the top input port of the N×1 port coarse WDM multiplexer 1204. Another set of ECLs 1-M connects to the second input port of the N×1 port coarse WDM multiplexer 1204 through a similar optical network. Note that each input port of the N×1 port coarse WDM multiplexer 1204 receives a superchannel (also referred to as a super-channel). The N×1 port coarse WDM multiplexer 1204 is configured to receive a single superchannel (of light) at each of its N input ports, combine (multiplex) the superchannels (of light), and output the combined superchannels (of light) over the pass band of the N×1 port coarse WDM multiplexer 1204. Although the coarse WDM multiplexer 1204 is shown, it is contemplated that a dense wavelength division multiplexing multiplexer (DWDM) may be utilized. The N×1 port coarse WDM multiplexer 1204 has N input ports on the left side and one output port on the right side.

The power monitors 18 (PM1, PM2) monitor each of the ECLs 1-M at two separate locations. The power monitor 18 (PM1) is connected to the output of the laser cavity 24 (ECL) (i.e., connected to the output band-reflect grating with passive phase compensation 140). The power monitor 18 (PM2) is connected to one output port of each 2×2 port modulator 1202. The power monitor 18 (PM3) is connected to/taps into and monitors the superchannel output of N×1 port CWDM multiplexer 1204 that is bound for the receiver 2100 in FIG. 21. The microcontroller 1220 receives feedback from each power monitor 18 (PM1, PM2, PM3).

FIG. 19 also includes the thermistor 1222, current output digital-to-analog converters (DAC) 1224 for powering (e.g., provide electrical current) each of the respective intra-cavity transmission-mode optical band-pass filters 120, and the DACs 1224. The DACs 1224 are controlled by the microcontroller 1220. Although not shown for simplicity, each of the intra-cavity transmission-mode optical band-pass filters 120 in the ECLs 1-M has its own DAC 1224. Although not shown for the sake of conciseness, the microcontroller 1220 is connected to and controls (directly and/or indirectly) the elements shown in FIG. 19.

The silicon chip 100 in FIG. 19 is configured for tuning, e.g., 4 ECLs 1-M (which means 4 laser target wavelengths ($\lambda_{targets}$ 1-M)) within the pass band of CWDM transmitter for temperature insensitivity and superchannel construction according to an embodiment. Therefore, the silicon chip 100 in FIG. 19 is configured to tune the 4 target wavelengths within the allowable target wavelength range 1650 (in FIGS. 17A and 17B) in the N×1 port CWDM multiplexer 1204 while self-calibrating out the fabrication process variations in the N×1 port coarse WDM multiplexer 1204. In other words, the laser output of the 4 laser cavities 24 (4 ECLs 1-M) is tuned to be compatible with the N×1 port CWDM multiplexer 1204.

The microcontroller 1220 is configured to perform the self-calibration routine 1400 (in FIGS. 14A and 14B) separately for each ECL 1-M (i.e., for each laser) such that each target wavelength $\lambda_{target}$ (which is one target wavelength from each ECL 1-M) is self-calibrated to be within the CWDM pass band of the N×1 port CWDM multiplexer 1204, as discussed above along with additions further herein. Then, the microcontroller 1220 is configured to perform normal operation control in FIG. 15. Since only one laser (one ECL in FIG. 19) can be tuned at a time during the self-calibration routine 1400, each separate intra-cavity transmission-mode optical band-pass filter 120 must be referenced to either the red or blue edge of the CWDM pass band of the N×1 port CWDM multiplexer 1204 to ensure accuracy in relative frequency/wavelength alignment. There are two implementation options that can be added to the self-calibration routine 1400. In the option, the microcontroller 1220 starts the self-calibration sequence 1400 exactly as described herein. If the lasers (ECL 1-M) do not all calibrate to the same edge in FIGS. 17A and 17B, the microcontroller 1220 is configured to recalibrate any lasers (ECLs 1-M) initially referenced to the blue edge to the red edge instead. The second option is for the microcontroller 1220 to initially calibrate all lasers (each ECL 1-M) to the red edge as the default sequence. The calibration edge can always be shifted in the self-calibration algorithm by continuing the described procedure until a consistent edge of rising transmission or falling transmission is achieved.

The microcontroller 1220 is configured to provide channel spacing between each individual target wavelength generated in each ECL 1-M in FIG. 19. It is noted that each ECL 1-M generates a single target wavelength $\lambda_{target}$. As an example scenario, it may be assumed that there are 4 ECLs resulting in 4 target wavelengths, where M=4 (i.e., ECL 1 is tuned to generate $\lambda_{target}$ 1, ECL 2 is tuned to generate $\lambda_{target}$ 2, ECL 3 is tuned to generate $\lambda_{target}$ 3, ECL 4 is tuned to generated $\lambda_{target}$ 4). Referring back to FIGS. 17A and 17B for the 4 target wavelengths $\lambda_{target}$ 1-4, the microcontroller 1220 creates relatively coarse 2 nm DWDM channel spacing within standard 1270/1290/1310/1330 CWDM grids; this provides 4×4 superchannel transceivers for 25 Gb/s×16=400 Gb/s aggregate bandwidth. The designed DWDM channel wavelength separation should account for the variability in the control DACs 1224, along with the accuracy of the thermal impedance and thermo-optic tuning rates. The channel separation referenced to the red or blue calibration edge in terms of wavelength is determined by $\delta_{offset}$ (d$\lambda$/d$\delta$). The parameter of d$\lambda$/d$\delta$ has some residual uncertainty due to variations in the thermal impedance and thermo-optic tuning rates that are observed in manufacturing. As a result, the wavelength spacing between superchannel targets should be sufficiently large that these variations do not result in performance degradation.

The resonant filter frequencies can either be designed to be identical (within fabrication precision) or offset with a resonant frequency step representative of the DWDM grid. Offset filters may minimize total tuning power required for stabilization but this may add complexity.

Figure 20:
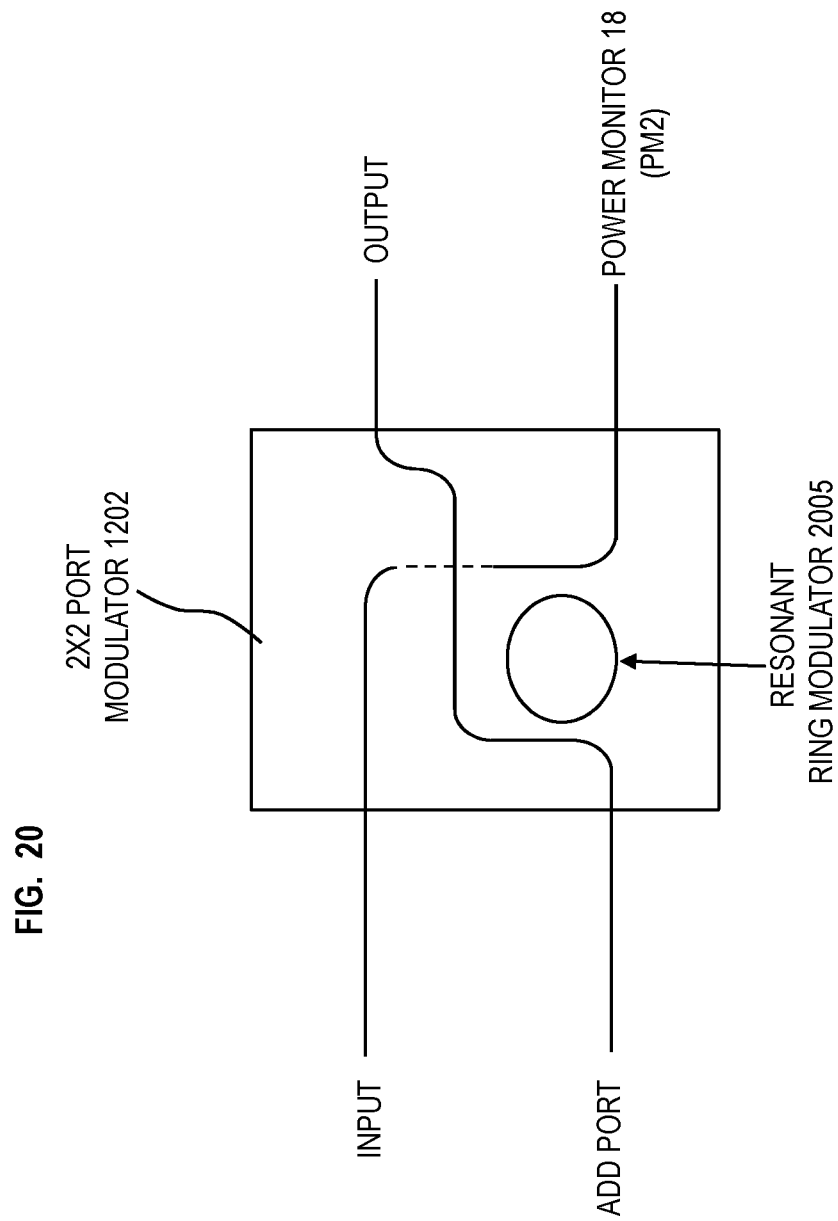
FIG. 20 illustrates an example implementation of a 2×2 port modulator according to an embodiment.

Now turning to FIG. 20, an example implementation of the 2×2 port modulator 1202 is provided according to an embodiment. There is one 2×2 port modulator 1202 per channel (i.e., per ECL 1-M). The input port of the 2×2 port modulator 1202 is connected to the respective ECL 1-M, and the add port on the left input side is connected to the output from the previous 2×2 port modulator 1202 in the cascading chain. The 2×2 port modulator 1202 is connected to the power monitor 18 (PM2) per ECL 1-M, and the output of the 2×2 port modulator 1202 corresponding to ECL 1 goes to one input port of the N×1 port CWDM multiplexer 1204.

The resonant ring modulator 2005 (e.g., a ring resonator) has a ring modulator resonant frequency. Wavelengths away from (i.e., off resonance with) the ring modulator resonant frequency pass from the add port to output without interference, and these wavelengths are off resonance light. The light at the input port is assumed to be on resonance with the ring modulator resonant frequency, and thus pass to the output port. For light from the add port that is on resonance with the light at the input port, the 2×2 port modulator 1202 adds the light of the add port to the light of the input port and sends the combined light to the output port.

Optimizing inverse eye on power monitor 18 (PM2) enables simple feedback operation to the microcontroller 1220. Matching resonator characteristics of intra-cavity Si-ECL filter (intra-cavity transmission-mode optical band-pass filter 120) ease wavelength alignment control difficulty.

Figure 21:
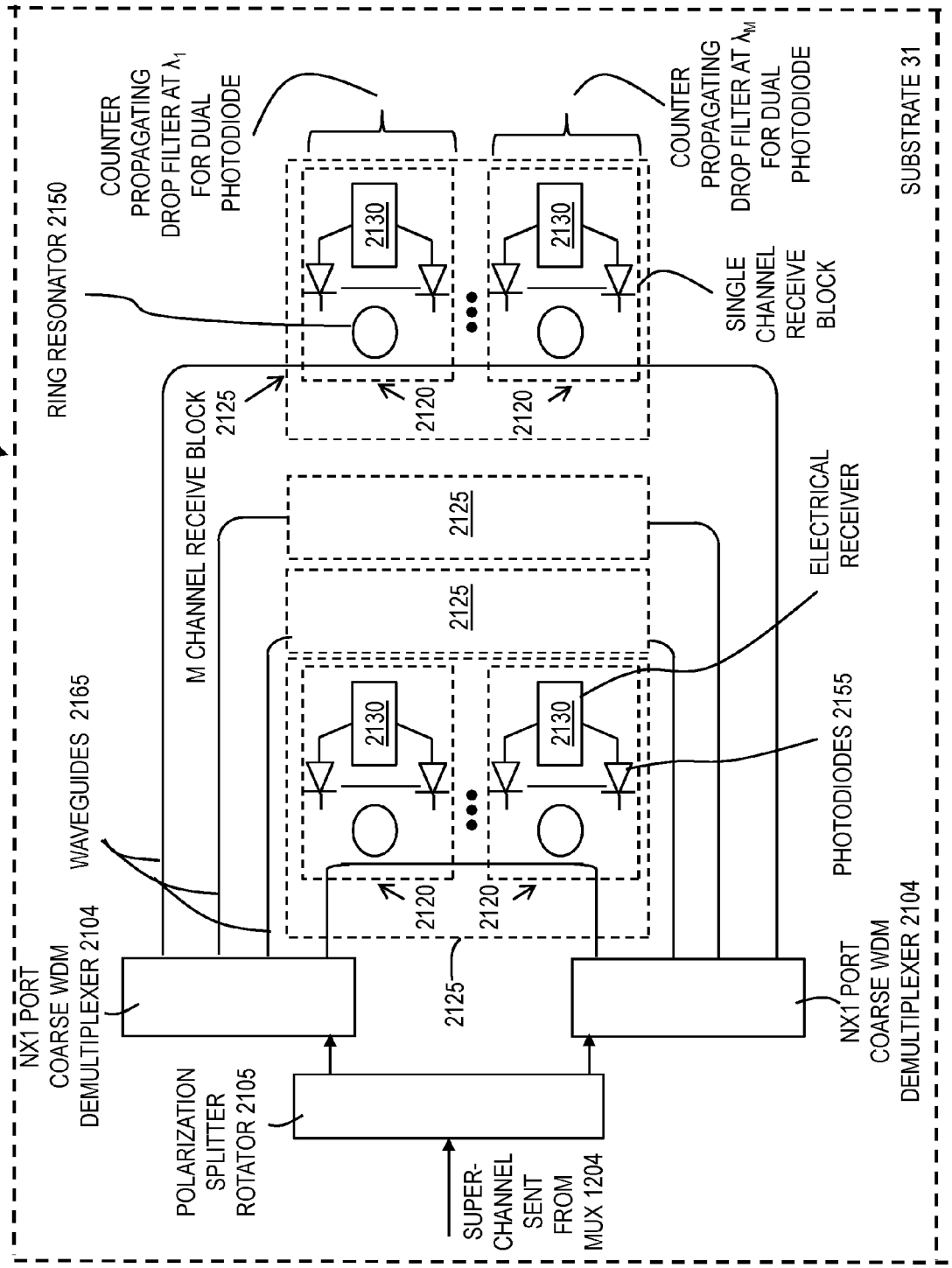
FIG. 21 illustrates a superchannel laser receiver according to an embodiment.

FIG. 21 illustrates the superchannel DWDM/CWDM receiver 2100 (receiver module) which receives the superchannel of light transmitted from the output of the N×1 port coarse WDM multiplexer 1204 in FIG. 19 according to an embodiment.

The superchannel CWDM receiver 2100 may be on a substrate 31. The substrate 31 may have the same features as the substrate 30. The superchannel CWDM receiver 2100 includes a polarization splitter rotator 2105 configured to receive and split the received light of the superchannel (output from the transmitter silicon chip 100 in FIG. 19 (or FIG. 12)). The polarization splitter rotator 2105 outputs the light to the input of two N×1 port CWDM multiplexers 2104. The N×1 port CWDM multiplexers 2104 demultiplexes the received light and then outputs the demultiplexed light to four counter propagating drop filters (2120) at $\lambda_1$ through $\lambda_M$ for dual photodiodes. The counter propagating drop filters 2120 are channel dropping filters that access one channel (i.e., one target wavelength $\lambda_{target}$) of a wavelength division multiplexed (WDM) signal, while not disturbing the other channels (other target wavelength $\lambda_{targets}$). In other words, the counter propagating drop filters single channel receive block 2120 captures the light at a particular target wavelength and generates an electrical signal that is sent to an electrical receiver 2130. Each of the four example counter propagating drop filters 2120 has its own electrical receiver 2130. The electrical receivers 2130 may be on chip 100 in one case, and off chip in another case. Each counter propagating drop filter 2120 has ring resonators 2150 which connect to the respective waveguides 2165 (one per counter propagating drop filter 2120). For the particular target wavelength $\lambda_{target}$ (channel) selected by the counter propagating drop filter 2120, the photodiodes 2155 convert the light energy into an electrical signal that is sent to the electrical receiver 2130. For each N outputs of the coarse WDM demultiplexer 2104, an M channel receive block 2125 is attached to form a complete superchannel receiver.

Figure 22:
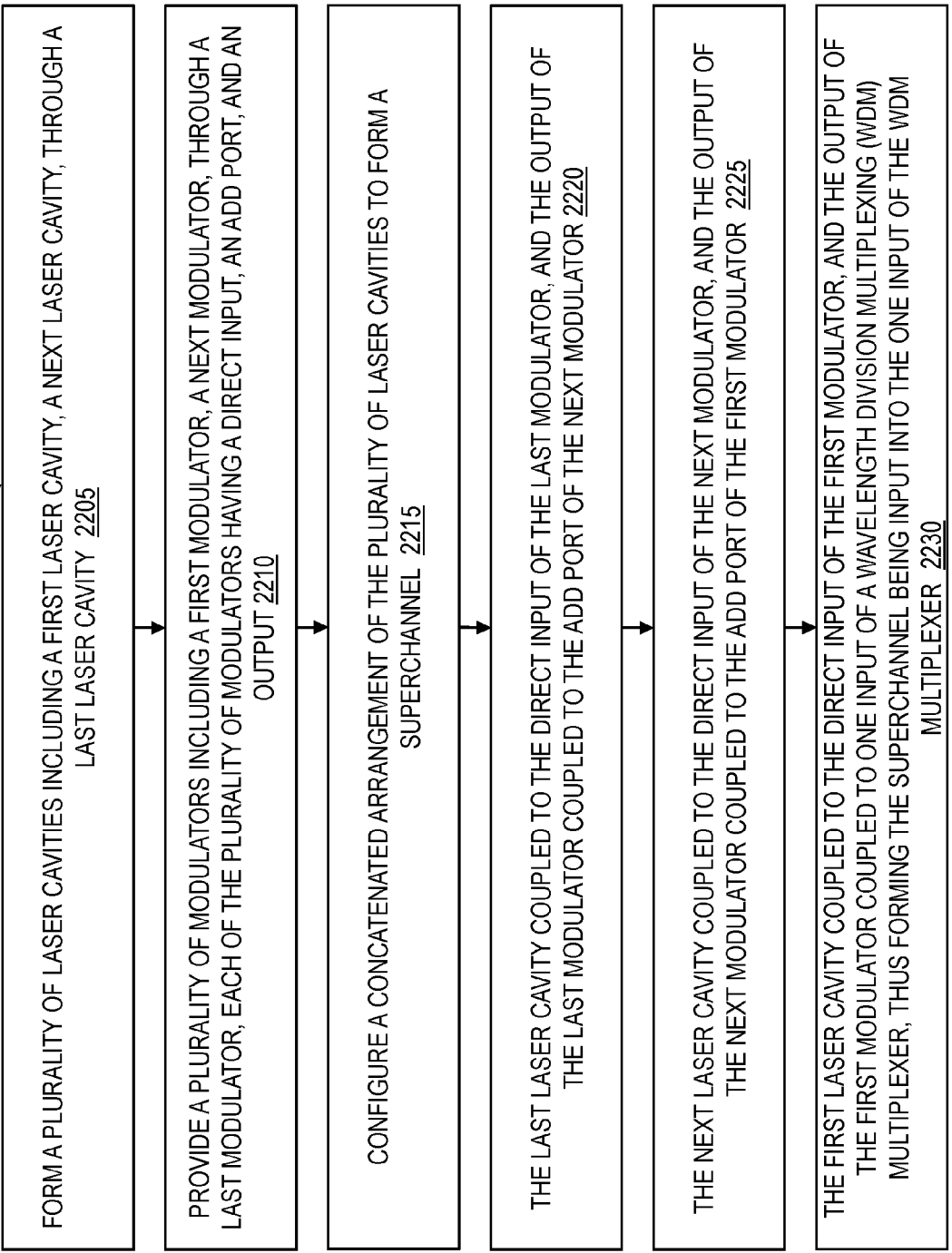
FIG. 22 is a method of creating one or more superchannels on a semiconductor chip according to an embodiment.

FIG. 22 is a method 2200 of creating one or more superchannels on a semiconductor chip 100 according to an embodiment. Numerous superchannels may be created using the techniques discussed herein. Each superchannel is input into one of the input ports of the N×1 port coarse WDM multiplexer 1204, although the ECLs 1-M corresponding creating one superchannel is illustrated in FIG. 19. The N×1 port coarse WDM multiplexer 1204 has N input ports and 1 output port.

At block 2205, a plurality of laser cavities 24 including a first laser cavity, a next laser cavity, through a last laser cavity (e.g., ECLs 1-M) are formed on the semiconductor chip 100.

At block 2210, a plurality of modulators 1202 including a first modulator, a next modulator, through a last modulator (e.g., the 2×2 port modulators 1202) are provided on the semiconductor chip 100, where each of the plurality of modulators 1202 has a direct input (e.g., the input connected to a single ECL), an add port (the port connected to (and adding) the outputs from other ECLs in a daisy chain), and an output port (e.g., the output port of the modulator 1202 that connects to the add port of the next modulator 1202).

At block 2215, a concatenated arrangement of the plurality of laser cavities 24 is configured to form a superchannel as shown in FIG. 19. In the concatenated arrangement, the last laser cavity 25 (e.g., ECL M) is coupled to the direct input of the last modulator 1202, and the output of the last modulator is coupled to the add port of the next modulator 1202, at block 2220. The add port of the last modulator 1202 (corresponding to ECL M) is not used or may not be present.

At block 2225, the next laser cavity 24 (e.g., ECL 3) is coupled to the direct input of the next modulator 1202, and the output of the next modulator 1202 is coupled to the add port of the first modulator. The same concatenated arrangement may continue for various ECLs and their corresponding modulators 1202 within the daisy chain until the top of the chain is reached. It is understood by one skilled in the art that the intervening arrangements a particular ECL coupling to its modulator 1202 are the same, and it is assumed that the first laser cavity and first modulator are at the top of the daisy chain.

At the top of the daisy chain in block 2230, the first laser cavity 24 (e.g., ECL 1) is coupled to the direct input of the first modulator 1202, and the output of the first modulator 1202 is coupled to one input of an N×1 port coarse wavelength division multiplexing multiplexer 1204, thus forming the superchannel (of laser light) that is input into one input port of the WDM multiplexer 1204 as shown in FIG. 19.

Another concatenated arrangement of another plurality of laser cavities (not shown but analogous to ELCs 1-M forming the top superchannel) forms another superchannel into the WDM multiplexer 1204, and the other superchannel is input into another input port of the WDM multiplexer 1204 in FIG. 19.

The N×1 port coarse wavelength division multiplexing multiplexer 1204 has a plurality of input ports (e.g., N), and each of the plurality of input ports is coupled to respective superchannels. The respective superchannels are individually formed by concatenated arrangements of different plurality of laser cavities.

Each of the plurality of laser cavities 24 includes an optical gain chip 10 attached to the semiconductor substrate 30 and the integrated photonic circuit 25 on the semiconductor substrate 30, where the optical gain chip is optically coupled to the integrated photonic circuit thereby forming a laser cavity 24. The integrated photonic circuit comprises: the active intra-cavity thermo-optic optical phase tuner element 230, the intra-cavity optical band-pass filter 120, and the output coupler band-reflect optical grating filter with passive phase compensation 140.

The WDM multiplexer may be a course wavelength division multiplexing multiplexer (which has been illustrated) and/or a dense wavelength division multiplexing multiplexer. The microcontroller 1220 is configured to calibrate each of the plurality of laser cavities 24 (per superchannel) to a WDM multiplexer pass band of the WDM multiplexer 1204 according to the self-calibration routine 1400. During the self-calibration routine, the microcontroller 1220 is configured to calibrate individual laser wavelengths of the plurality of laser cavities 24 to either a blue edge or a red edge of the WDM multiplexer pass band of the WDM multiplexer. The superchannel is formed by the individual laser wavelengths of the plurality of laser cavities 24. After performing the self-calibration routine, the microcontroller 1220 is configured to provide offsets between the individual laser wavelengths (i.e., to space the operating wavelengths) of the plurality of laser cavities in the superchannel.

It will be noted that various semiconductor device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A semiconductor chip configured as a receiver to receive a superchannel, the semiconductor chip comprising:
a polarization splitter rotator configured to receive and split received light of the superchannel;
wavelength division multiplexing (WDM) demultiplexers configured to demultiplex the received light; and
counter propagating drop filters configured to capture the received light at a particular target wavelength and generate an electrical signal;
wherein each of the counter propagating drop filters is coupled to an electrical receiver, the electrical receiver receives the electrical signal corresponding to the particular target wavelength.

2. The semiconductor chip of claim 1, wherein the counter propagating drop filters comprise a ring resonator configured to capture the received light at the particular target wavelength from a waveguide.

3. The semiconductor chip of claim 2, wherein the counter propagating drop filters each comprise a photodiode that converts the received light at the particular wavelength into the electrical signal that is sent to the electrical receiver.

4. The semiconductor chip of claim 1, wherein the counter propagating drop filters are channel dropping filters.

5. The semiconductor chip of claim 4, wherein the wavelength division multiplexing demultiplexers are configured to have wavelength division multiplexed signals.

6. The semiconductor chip of claim 4, wherein the channel dropping filters are configured to access one channel of the received light from the wavelength division multiplexed signal, while not disturbing other channels.

7. The semiconductor chip of claim 6, wherein the one channel of the received light corresponds to the particular target wavelength.

8. The semiconductor chip of claim 1, wherein the wavelength division multiplexing demultiplexers are coupled to waveguides.

9. The semiconductor chip of claim 8, wherein the counter propagating drop filters are coupled to the waveguides.

10. The semiconductor chip of claim 9, wherein the counter propagating drop filters are configured to capture the received light from the waveguides.

11. A method of configuring a semiconductor chip as a receiver to receive a superchannel, the method comprising:
providing a polarization splitter rotator configured to receive and split received light of the superchannel;
providing wavelength division multiplexing (WDM) demultiplexers configured to demultiplex the received light; and
providing counter propagating drop filters configured to capture the received light at a particular target wavelength and generate an electrical signal;
wherein each of the counter propagating drop filters is coupled to an electrical receiver, the electrical receiver receives the electrical signal corresponding to the particular target wavelength.

12. The method of claim 11, wherein the counter propagating drop filters comprise a ring resonator configured to capture the received light at the particular target wavelength from a waveguide.

13. The method of claim 12, wherein the counter propagating drop filters each comprise a photodiode that converts the received light at the particular wavelength into the electrical signal that is sent to the electrical receiver.

14. The method of claim 11, wherein the counter propagating drop filters are channel dropping filters.

15. The method of claim 14, wherein the wavelength division multiplexing demultiplexers are configured to have wavelength division multiplexed signals.

16. The method of claim 14, wherein the channel dropping filters are configured to access one channel of the received light from the wavelength division multiplexed signal, while not disturbing other channels.

17. The method of claim 16, wherein the one channel of the received light corresponds to the particular target wavelength.

18. The method of claim 11, wherein the wavelength division multiplexing demultiplexers are coupled to waveguides.

19. The method of claim 18, wherein the counter propagating drop filters are coupled to the waveguides.

20. The method of claim 19, wherein the counter propagating drop filters are configured to capture the received light from the waveguides.

* * * * *